United States Patent
Nakatsugawa et al.

(10) Patent No.: US 8,525,121 B2
(45) Date of Patent: Sep. 3, 2013

(54) RADIOLOGICAL IMAGE DETECTION APPARATUS AND METHOD OF MANUFACTURING THE SAME

(75) Inventors: Haruyasu Nakatsugawa, Kanagawa (JP); Yasuhisa Kaneko, Kanagawa (JP); Naoto Iwakiri, Kanagawa (JP)

(73) Assignee: Fujifilm Corporation (JP)

( * ) Notice: Subject to any disclaimer, the term of this patent is extended or adjusted under 35 U.S.C. 154(b) by 0 days.

(21) Appl. No.: 13/372,301

(22) Filed: Feb. 13, 2012

(65) Prior Publication Data

US 2012/0205544 A1  Aug. 16, 2012

(30) Foreign Application Priority Data

Feb. 14, 2011 (JP) .................... 2011-028972

(51) Int. Cl.
*G01T 1/20* (2006.01)

(52) U.S. Cl.
USPC .................... 250/367; 257/E31.129

(58) Field of Classification Search
USPC ............. 250/367, 370.09, 370.11, 486.1
See application file for complete search history.

(56) References Cited

U.S. PATENT DOCUMENTS

| | | | |
|---|---|---|---|
| 2008/0083877 A1 | 4/2008 | Nomura et al. | |
| 2008/0245968 A1* | 10/2008 | Tredwell et al. | 250/370.09 |
| 2010/0127279 A1 | 5/2010 | Takahashi | |
| 2011/0006213 A1 | 1/2011 | Sato et al. | |

FOREIGN PATENT DOCUMENTS

| | | |
|---|---|---|
| JP | 2007-163467 A | 6/2007 |
| JP | 2008-051793 A | 3/2008 |
| JP | 2011-017683 A | 1/2011 |

\* cited by examiner

*Primary Examiner* — David Porta
*Assistant Examiner* — Faye Boosalis
(74) *Attorney, Agent, or Firm* — Studebaker & Brackett PC

(57) ABSTRACT

A radiological image detection apparatus, includes: two scintillators that convert irradiated radiation into lights; and a photodetector arranged between two scintillators, that detects the lights converted by two scintillators as an electric signal; in which: an activator density in the scintillator arranged at least on a radiation incident side out of two scintillators in vicinity of the photodetector is relatively higher than an activator density in the scintillator on an opposite side to a photodetector side.

19 Claims, 14 Drawing Sheets

RADIOLOGICAL IMAGE DETECTION APPARATUS AND METHOD OF MANUFACTURING THE SAME

CROSS-REFERENCE TO RELATED APPLICATIONS

This application is based on and claims priority under 35 USC 119 from Japanese Patent Application No. 2011-028972 filed on Feb. 14, 2011; the entire content of which is incorporated herein by reference.

BACKGROUND

1. Technical Field

The present invention relates to a radiological image detection apparatus used in the medical X-ray imaging system etc., and a method of manufacturing the same.

2. Related Art

In recent years, DR (Digital Radiography) using the X-ray image detection apparatus such as FPD (Flat Panel Detector) that converts an X-ray image into digital data, or the like is already put to practical use. In contrast to the former CR (Computed Radiography) system using the imaging plate formed of the stimulative phosphor (accumulative phosphor), this X-ray image detection apparatus has such a merit that the picked-up image can be checked on the spot, and thus its spread is proceeding apace.

Various systems have been proposed for an X-ray image detection apparatus. As one of them, the indirect conversion system, which converts the X rays into the visible lights once by the scintillator such as CsI:Tl, GOS ($Gd_2O_2S$:Tb), or the like, and then converts the visible lights into the electric charges by the semiconductor layers and stores such electric charges, has been known (see Patent Document 1 (JP-A-2007-163467), Patent Document 2 (JP-A-2008-51793) and Patent Document 3 (JP-A-2011-17683), for example).

In the X-ray image detection apparatus, in many cases it is preferable that the X-ray exposure should be set low when this detecting device is used for the X-ray radiography of a living body, for example. Therefore, the scintillator whose sensitivity to the X-rays is high and whose amount of luminescence is large is demanded. In Patent Document 1, an amount of luminescence is enhanced by providing the scintillator on both sides of the photodetector respectively to put it between them.

Also, in Patent Document 2, an amount of luminescence is enhanced by adding the activator to the base material of the fluorescent material. In Patent Document 2, it is set forth that, in the X-ray image detection apparatus which includes the photodetector and the scintillator and in which the X-rays are incident on the scintillator from the opposite side to the photodetector, the activator density in the region of the scintillator on the X-ray incident side should be enhanced.

Also, in Patent Document 3, an amount of luminescence is enhanced by setting the region of the scintillator, which is located in vicinity to the photodetector, as the main luminescence region S in the situation that the scintillator is irradiated with the X-rays from the photodetector side.

Here, it may be considered that an activator density on the X-ray incident side should be increased, as set forth in Patent Document 2, and also the photodetector side should be set as the main luminescence region, as set forth in Patent Document 3. In this manner, when an activator density is enhanced in vicinity to the photodetector on the X-ray incident side, the effect of increasing amount of luminescence and improving MTF (Modulation Transfer Function) can be achieved to a certain extent. However, when such main luminescence region of the scintillator is examined in detail, the following problems still remain. That is, an increase of an activator density poses clearly the technical problems mentioned hereunder.

The crystallinity of the part of the main luminescence region, which is located in vicinity of the photodetector, is disordered due to the increase of the activator density, and accordingly the degradation of MTF is caused. In particular, when an activator density is enhanced in the initial phase of the vapor deposition of the scintillator, such enhancement has a tremendous adverse influence on the crystal growth of the scintillator, and the crystallinity is disordered. Therefore, the lights are diffused between the columnar crystals, and thus degradation of MTF is caused.

Also, the absorption of lights in the scintillator is increased due to an increase of the activator density. Here, as shown in FIG. 14, such a case is considered that an activator density is enhanced in the situation that the part of a scintillator 91 located on the X-ray incident side is set as the main luminescence region S. As shown in FIG. 15A and FIG. 15B, in a part P2 that is positioned away from a photodetector 92 (FIG. 14) in the main luminescence region S, an amount of luminescence incident on the photodetector 92 is small, and a light emitting condition is spread, and thus blurriness of the image is caused (MTF is worsened). As a result, even though such a configuration is employed that, as shown in FIG. 14, the scintillator 91 is irradiated with the X rays from the photodetector 92 side, a further increase of an amount of luminescence and a further improvement in MTF cannot be expected unless such problems are solved.

SUMMARY

An illustrative aspect of invention is to provide a radiological image detection apparatus capable of achieving a further increase of an amount of luminescence and a further improvement in MTF, and a method of manufacturing the same.

According to an aspect of the invention, a radiological image detection apparatus includes: two scintillators that converts irradiated radiation into lights; and a photodetector arranged between two scintillators, that detects the lights converted by two scintillators as an electric signal; in which an activator density in the scintillator arranged at least on a radiation incident side out of two scintillators in vicinity of the photodetector is relatively higher than an activator density in the scintillator on an opposite side to a photodetector side.

According to another aspect of the invention, a radiological image detection apparatus includes: two scintillators that converts irradiated radiation into lights; and a photodetector arranged between two scintillators, that detects the lights converted by two scintillators as an electric signal; in which an activator density in at least one scintillator out of two scintillators in vicinity of the photodetector is changed repeatedly between a high density and a low density in a radiation traveling direction.

According to another aspect of the invention, a method of manufacturing the aforementioned radiological image detection apparatus, includes: forming the photodetector on a substrate; and peeling off the substrate from the photodetector.

With the configurations and process, the scintillator is provided on both sides of the photodetector respectively to put it between them and also an activator density in vicinity of the photodetector is enhanced. As a result, a further increase of an amount of luminescence and a further improvement in MTF can be achieved.

DETAILED DESCRIPTION

An example of an X-ray image detection apparatus (a radiological image detection apparatus) to explain an embodiment of the present invention will be explained with reference to FIG. 1 to FIG. 7B hereinafter.

Here, the same reference symbols are affixed to the similar configurations to those being already described, and their explanations will be omitted or simplified hereinafter.

In the following, explanation will be made by taking an X-ray image detection apparatus as one type of the radiological image detection apparatuses. A configuration described hereinafter is applicable to the radiological image detection apparatuses using various radiations such as α rays, β rays, γ rays, etc. According to these radiological image detection apparatuses using various radiations such as α rays, β rays, γ rays, etc., the operations and effects substantially similar to those described hereinafter can be achieved.

[1. Overall Configuration]

Figure 1:
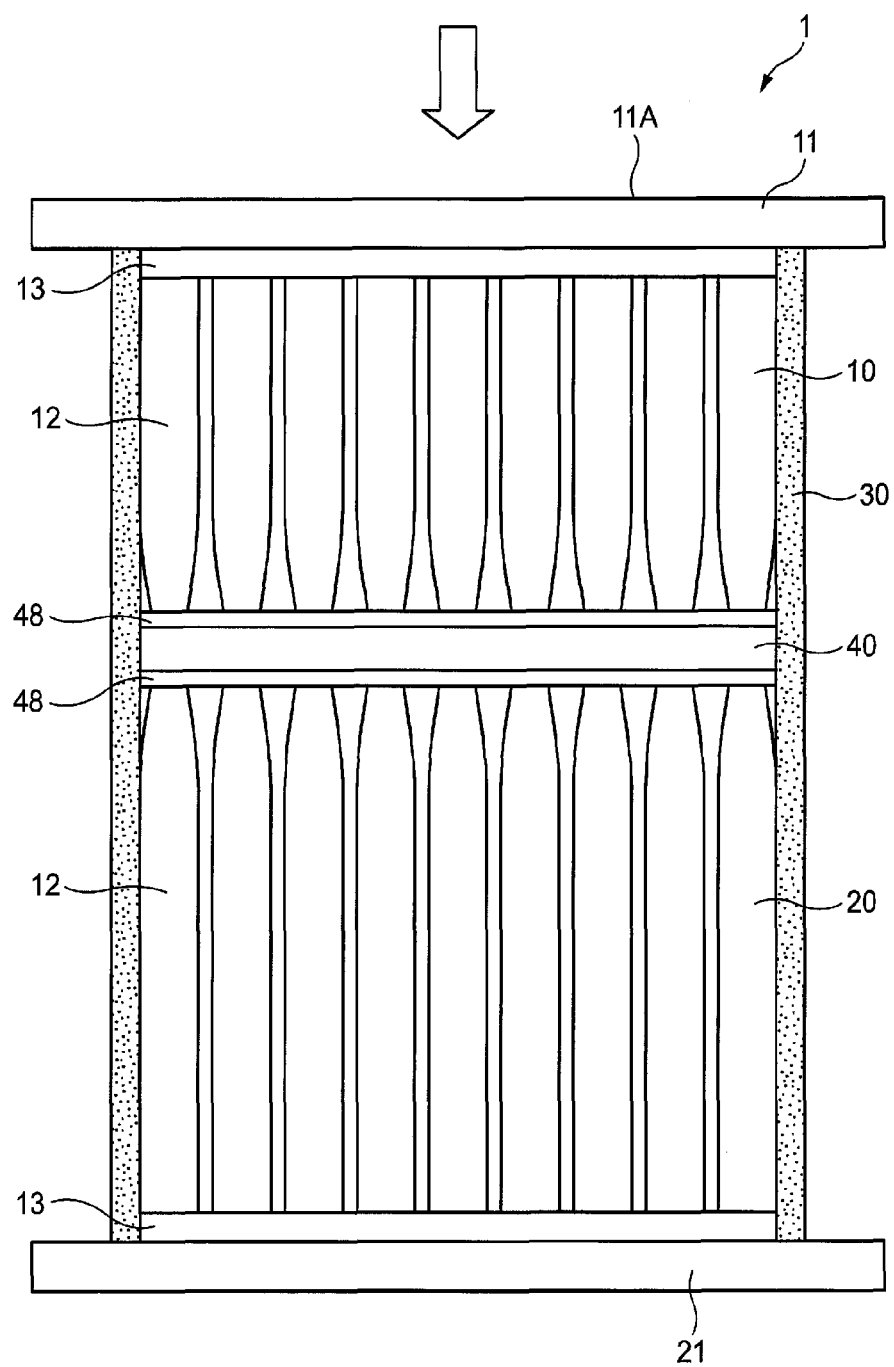
FIG. 1 is a side sectional view showing schematically a schematic configuration of an X-ray image detection apparatus.

FIG. 1 is a side sectional view showing schematically a schematic configuration of an X-ray image detection apparatus 1 in the indirect conversion system. The X-ray image detection apparatus 1 includes a first scintillator 10 and a second scintillator 20 for converting the irradiated X rays (outline arrow in FIG. 1) into the lights, a sensor portion 40 acting as a photodetector for detecting the lights being converted by the first and second scintillators 10, 20 as electric signals, a protection film 30 for covering the first and second scintillators 10, 20, and control modules (not shown) provided to the second scintillator 20 on the opposite side to the X-ray incident side respectively.

The protection film 30 seals the first and second scintillators 10, 20 and the sensor portion 40 between a support 11, onto which the first scintillator 10 is deposited, and a support 21, onto which the second scintillator 20 is deposited. This protection film 30 is formed of parylene, or the like by the vapor deposition method. This parylene protection film 30 has good adhesion performance to the scintillators 10, 20, and also has flexibility. Therefore, this protection film 30 has good follow-up performance to a bowing of the supports 11, 21, and the like.

In the X-ray image detection apparatus 1, the X rays that are passed through a subject (outline arrow) are irradiated from the first scintillator 10 side to the second scintillator 20 side. A surface of the support 11 constitutes an X-ray incident plane 11A. When the X rays are incident on the first scintillator 10, this first scintillator 10 absorbs the X rays to emit the lights, and then the lights are incident on PDs 41 of the sensor portion 40. The electric charges being accumulated in the PDs 41 are output from TFTs 42 as electric signals.

Also, the X rays are passed through the sensor portion 40 and are incident on the second scintillator 20. When the X rays are incident on the second scintillator 20, this second scintillator 20 also absorbs the X rays and then emits the lights, and then the lights are incident on the PDs 41 of the sensor portion 40.

In an example shown in FIG. 1, an increase in an amount of luminescence of the second scintillator 20 is attained by setting a thickness of the second scintillator 20, which is located away from the X-ray incident plane 11A, larger than a thickness of the first scintillator 10. In this case, respective thicknesses of the first and second scintillators 10, 20 can be decided appropriately.

Each of the control modules (not shown) has ICs as controlling portions for driving/controlling the sensor portion 40, a circuit substrate on which an IC for processing image signals, etc. are mounted, a power supply circuit, and the like. The control modules are assembled integrally with the first and second scintillators 10, 20 and the sensor portion 40.

[2. Configuration of Sensor Portion]

Figure 2:
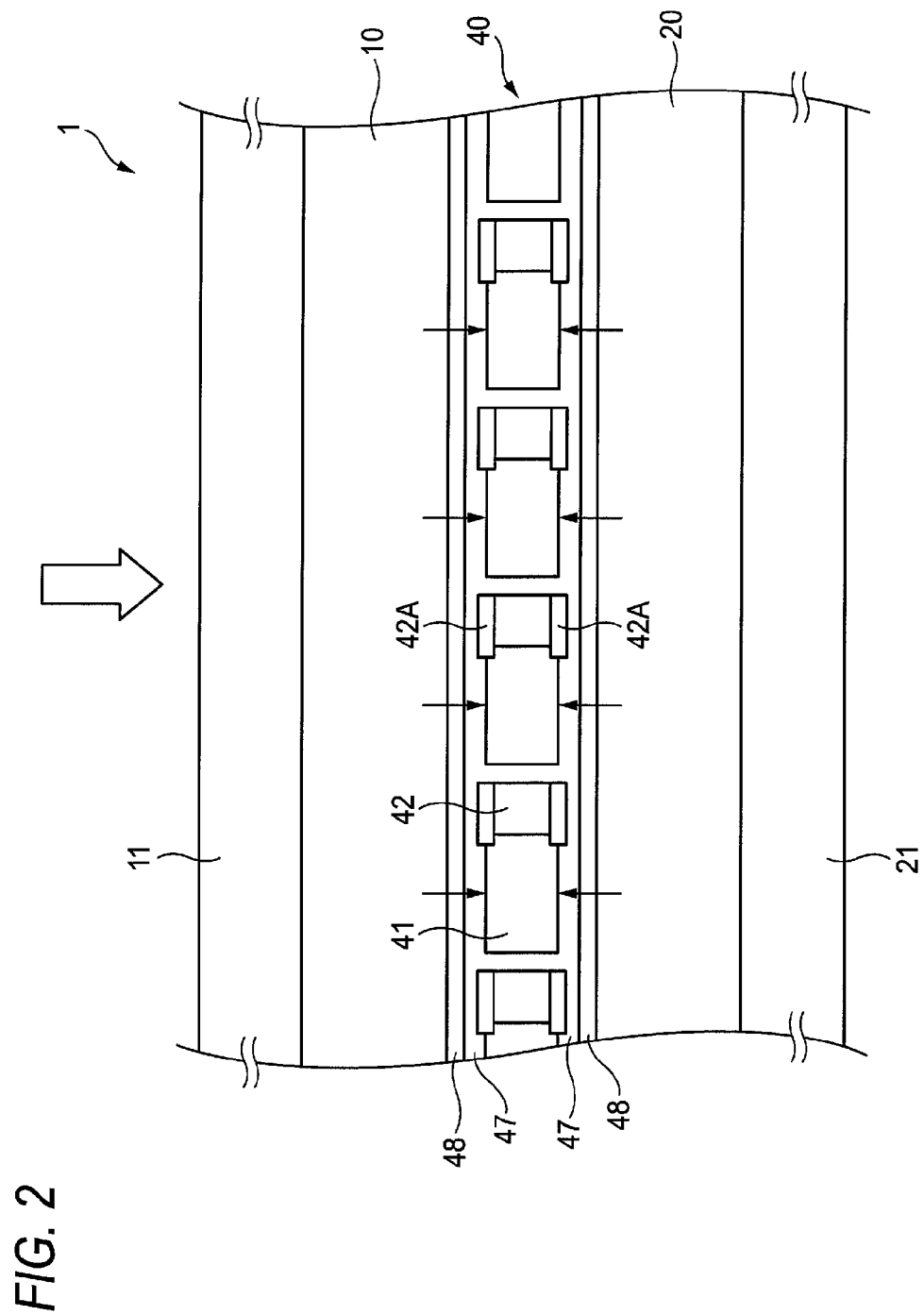
FIG. 2 is a side sectional view showing schematically a schematic configuration of a sensor portion.
Figure 3:
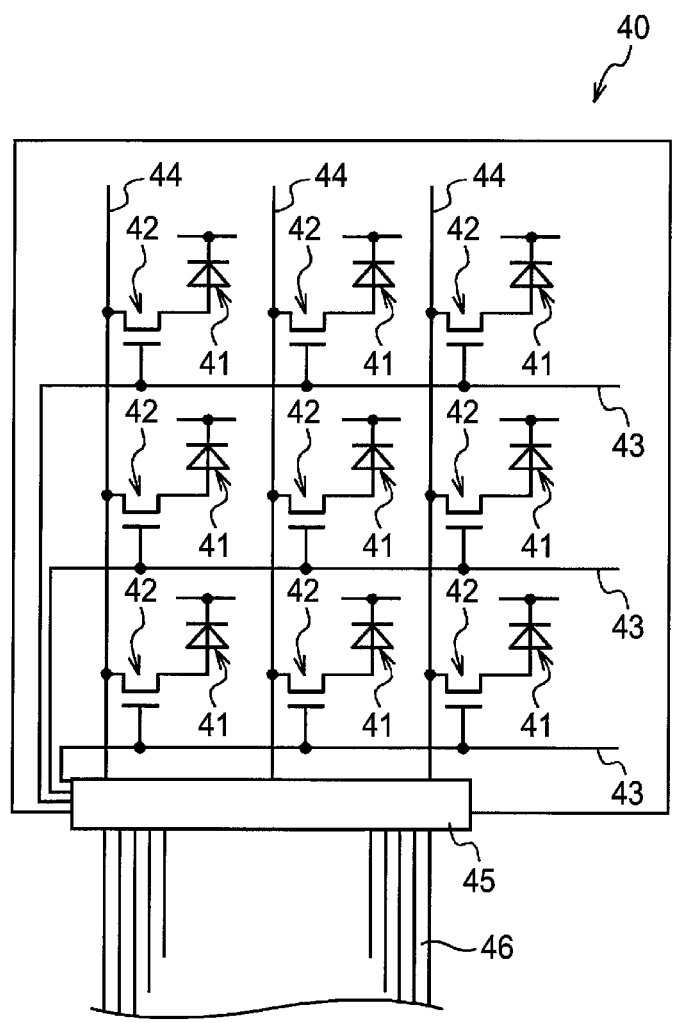
FIG. 3 is a plan view showing schematically a configuration of the sensor portion.

FIG. 2 is a side sectional view showing schematically a configuration of the sensor portion 40. FIG. 3 is a plan view showing the elements that are two-dimensionally aligned.

The sensor portion 40 has the PDs (Photodiodes) 41 each formed of a-Si, or the like, and the TFTs (Thin Film Transistors) 42 as the thin film switching devices each formed of a-Si, or the like.

Each of the PDs 41 is constructed to have a photoelectric layer that converts the lights (arrows indicated with a solid line in FIG. 2 respectively), which are incident from both first and second scintillators 10, 20, into the electric charges.

Each of the TFTs 42 is arranged in the position that is planarly adjacent to the PD 41 on the same plane or the substantially same plane as the PD 41. A light reflecting layer 42A for reflecting the lights is provided on both sides of the TFTs 42 in the thickness direction respectively. Since the light reflecting layer 42A is provided, occurrence of switching noises of the TFTs 42 can be suppressed.

As shown in FIG. 3, the PDs 41 are two-dimensionally aligned, and each PD 41 corresponds to the pixel of the image that is detected by the sensor portion 40.

As shown in FIG. 3, the TFT 42, a gate line 43, and a data line 44 are provided to each PD 41 respectively. Each gate line 43 and each data line 44 are provided to extend to a connection terminal 45, and are connected to the circuit substrate of the control module via a flexible wiring 46 made of an anisotropic conductive film, or the like, which is connected to this connection terminal 45. According to the control signal that is fed through the gate line 43 from the controlling portion that is mounted on the circuit substrate, the ON/OFF operation of respective TFTs 42 is switched on a row basis. Then, the electric charges of the PD 41 whose TFT 42 is kept in its ON state are read out to a signal processing portion of the circuit substrate as an image signal via the data line 44. When the electric charges of the PD 41 are read out sequentially on a row basis, the two-dimensional image is detected.

The PDs 41 and the TFTs 42 are formed on a substrate (not shown) made of Al, glass, or the like by the photo etching process, or the like, and then are peeled off from this substrate. In other words, the X rays are never absorbed by the substrate since the substrate is removed from the sensor portion. Hence, not only the X-ray dose that is incident on the second scintillator 20 via the first scintillator 10 can be increased, but also the lights emitted from the second scintillator 20 can be incident on the PDs 41 without absorption in the substrate. As a result, an amount of lights incident on the PDs 41 can also be increased. Also, the peeled substrate can be reused.

With regard to the method of peeling off the sensor portion 40 from the substrate, the literature such as JP-A-2000-133809, JP-A-2003-66858, JP-A-2003-45890, and the like are informatively utilized.

Here, when the substrate is thinned or removed by the chemical dissolving method or the polishing method other than the peeling of the substrate, the advantages similar to the substrate peeling can be attained.

In FIG. 2, both side surfaces of the sensor portion 40 in the thickness direction are planarized by a resin film 47, but this resin film 47 may be omitted. The sensor portion 40 is pasted on the first and second scintillators 10, 20 via an adhesive layer 48 respectively. Thus, the first and second scintillators 10, 20 adhere closely to the sensor portion 40 via the adhesive layer 48 respectively.

Here, the adhesive layer 48 and the resin film 47 may be eliminated between the sensor portion 40 and the first and second scintillators 10, 20 respectively. Also, the first and second scintillators 10, 20 may be pressed against the surface of the sensor portion 40 respectively, and be forced to stick directly to this surface.

The resins constituting the resin layers such as the planarizing layer, the adhesive layer, the matching oil layer formed of a transparent liquid or a gel, etc., which are provided between the sensor portion 40 and the first and second scintillators 10, 20 respectively, are not particularly restricted. Any resins may be used if these resins scarcely attenuate the scintillation light being emitted from the first and second scintillators 10, 20 and allows such light to reach the sensor portion 40.

As the resin constituting the planarizing layer, polyimide, parylene, and the like can be used. The polyimide whose deposition property is good is preferable.

As the adhesives constituting the adhesive layer, the material that is optically transparent to the scintillation light being emitted from the first and second scintillators 10, 20 is preferable. For example, a thermoplastic resin, a UV cure adhesive, a thermosetting adhesive, a room-temperature curable adhesive, a double-sided adhesive sheet, and the like may be listed. From the viewpoint that sharpness of the image should not be degraded, it is referable that the adhesive made of a low viscosity epoxy resin should be employed since an adhesive layer that is made sufficiently thinner than a pixel size of the sensor portion 40 can be formed.

Also, from the viewpoint of sensitivity and picture quality, it is preferable that a thickness of the resin layers such as the planarizing layer, the adhesive layer, etc. should be set to 50 µm or less. It is more preferable that a thickness of such resin layers should be set within a range of 5 µm to 30 µm.

[3. Configuration of Scintillator]

[3-1. Support]

The support 11 is formed of the material such as Al, or the like, whose X-ray transmittance is high but which reflects the lights, like a plate. The support 11 is not restricted to the plate made of Al, and can be chosen appropriately from a carbon plate, CFRP (carbon fiber reinforced plastic), a glass plate, a quartz substrate, a sapphire substrate, and the like. Also, the support 11 is not particularly restricted to them so far as the scintillator can be formed on the surface of the support. Here, in case the support 11 is also used as a light reflecting member, a light metal such as Al, or the like may be used as the material of the support.

The support 21 can be formed of the material similar to the support 11. Since the support 21 is arranged on the opposite side to the support 11 side that is irradiated with the X rays, such support 21 may be formed of the material whose X-ray transmittance is small.

Here, the supports 11, 21 are not essential to the X-ray image detection apparatus 1. That is, the scintillator can be formed by the vapor deposition while using the substrate for the vapor deposition, and then such scintillator can be peeled off from the substrate and be used. Also, a light reflecting member can be provided on the opposite side of the scintillator to the sensor portion 40 side.

[3-2. Fluorescent Material]

The first and second scintillators 10, 20 are formed by adding Tl to a base material of CsI as an activator. An amount of luminescence can be enhanced by adding Tl.

The first and second scintillators 10, 20 in this example are formed by a group of columnar crystals in which the fluorescent material is grown like columns, and are formed by using CsI:Tl (thallium-activated cesium iodide) as the material. Further, NaI:Tl (thallium-activated sodium iodide), CsI:Na (sodium-activated cesium iodide), and the like can be used as the material of the first and second scintillators 10, 20. Because the emission spectrum is fit for a maximal value (around 550 nm) of the spectral sensitivity of the a-Si photodiode, it is preferable that CsI:Tl should be used as the material.

Here, the first and second scintillators 10, 20 may be formed to contain no columnar crystal. For example, the first and second scintillators 10, 20 may be formed by applying GOS ($Gd_2O_2S$:Tb (terbium-activated gadolinium trisulfide)) to the support.

[3-3. Distance Between Scintillators]

As described above, since the sensor portion 40 is obtained by peeling off from the substrate, and also the PDs 41 and the TFTs 42 are arranged planarly adjacent to each other, the first and second scintillators 10, 20 are positioned in very close vicinity to each other. It is preferable that a distance between the mutually opposing surfaces of the first and second scintillators 10, 20 should be set to 40 µm or less. More preferably, such distance should be set to 30 µm or less. In this manner, MTF can be improved by shortening the distance between the first and second scintillators 10, 20.

[3-4. Crystal Structure of Scintillator]

Figure 4:
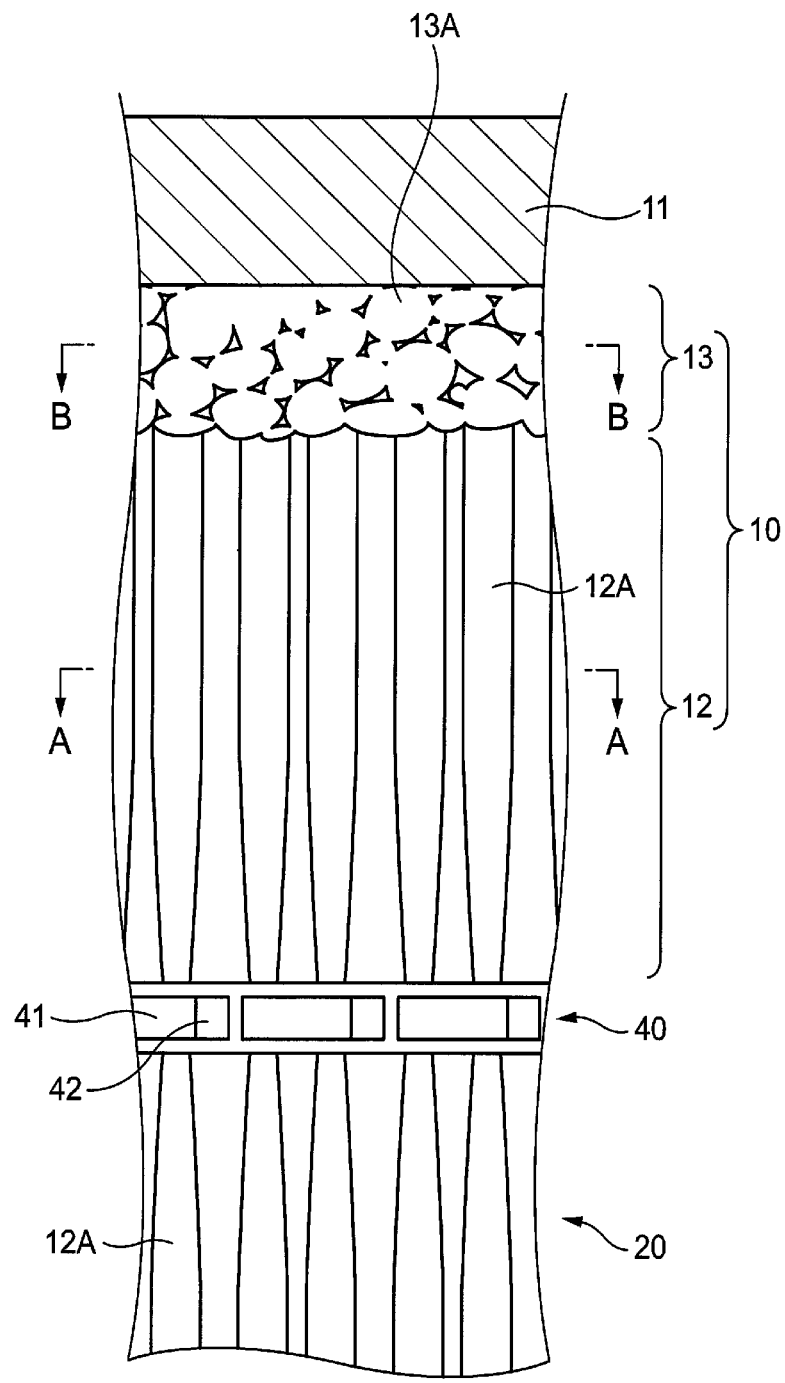
FIG. 4 is a side sectional view showing schematically a crystal structure of a scintillator.

FIG. 4 is a side sectional view showing schematically a crystal structure of the scintillator 10. The first scintillator 10 has a columnar portion 12 formed by a group of columnar crystals 12A, and a non-columnar portion 13 containing a non-columnar crystal 13A that is formed on the base ends of the columnar crystals 12A. Here, the non-columnar portion 13 has the light reflecting characteristics described later, and also contributes an improvement in adhesion to the support 11 and an improvement in crystallinity of the columnar crystals 12A. But this non-columnar portion 13 may not be formed. The lights can be reflected toward the sensor portion 40 by the support 11 made of Al, or the like even when the non-columnar portion 13 is not provided.

The fluorescent lights emitted from the first scintillator 10 in response to the irradiation of the X rays are guided in the height direction of the columns (crystal growing direction) by the columnar crystals 12A, and then are incident on the sensor portion 40. At this time, a part of the lights that travel toward the support 11 side is reflected by the support 11, and is incident on the sensor portion 40.

(Configuration of the Columnar Portion)

The columnar portion 12 is an aggregate of a large number of columnar crystals 12A. In an example shown in FIG. 4, each columnar crystal 12A stands up substantially perpendicularly to the support 11. The columnar crystal 12A in this example is formed like a tapered-down shape on the top end side. The top end portion of the columnar crystal 12A may be polished. The top end portions of a plurality of columnar crystals 12A oppose to one pixel (PD41) of the sensor portion 40.

The columnar crystals 12A have good crystallinity in contrast to the non-columnar crystal, and have a large amount of luminescence of the fluorescent lights respectively. Also, the columnar crystals 12A adjacent to each other via a void are provided to stand up in the thickness direction of the support 11. Therefore, the columnar crystal 12A acts as a guide of light to guide the lights in the height direction of the columns. Since the diffusion of the lights between the pixels can be suppressed based on the light guiding effect given by the columnar crystal 12A, sharpness of the detected image can be increased.

Figure 5:
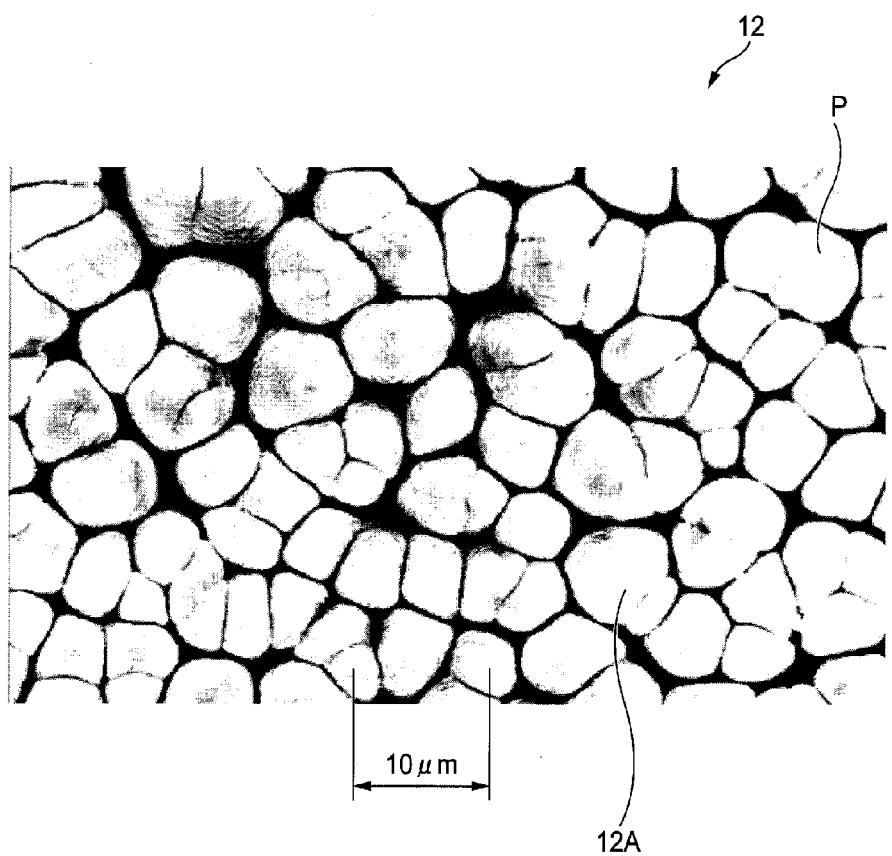
FIG. 5 is an electron microscope photograph showing a columnar crystal section (SEM image).

FIG. 5 is an electron microscope photograph of the columnar portion 12 taken in an A-A section (an almost center section in the height direction of the columnar portion 12) in FIG. 4. There are voids between the adjacent columnar crystals 12A (portions that appear to be dark in FIG. 5). Each of the columnar crystals 12A has an almost uniform sectional diameter in the growth direction of the crystal. The adjacent columnar crystals 12A are bonded together in a part of the region of the columnar portion 12 to constitute one columnar body (for example, P in FIG. 5).

In view of an X-ray absorptive power corresponding to a required sensitivity, a thickness of the columnar portion 12 is set to about 200 μm in the mammography application, and is set to 500 μm or more in the common radiographic application. In this case, even though a thickness of the columnar portion 12 is set too thick, a utilization factor of light emission tends to decrease due to absorption, scattering, etc. of light. Therefore, a thickness of the columnar portion 12 is decided at an appropriate value while considering a sensitivity and a utilization factor of light emission respectively.

(Configuration of the Non-Columnar Portion)

As shown in FIG. 4, the non-columnar portion 13 is constructed to contain the substantially spherical or indefinitely shaped non-columnar crystal 13A. In some cases, the non-columnar portion 13 may contain the amorphous part.

From the viewpoint that a void is easily kept between the crystals and reflection efficiency can be increased highly, it is preferable that a shape of the non-columnar crystal 13A should be substantially spherical. That is, it is preferable that the non-columnar portion 13 should be constructed by an assembly of the quasi-spherical crystals (the non-columnar crystals 13A as the substantially spherical crystals).

Figure 6:
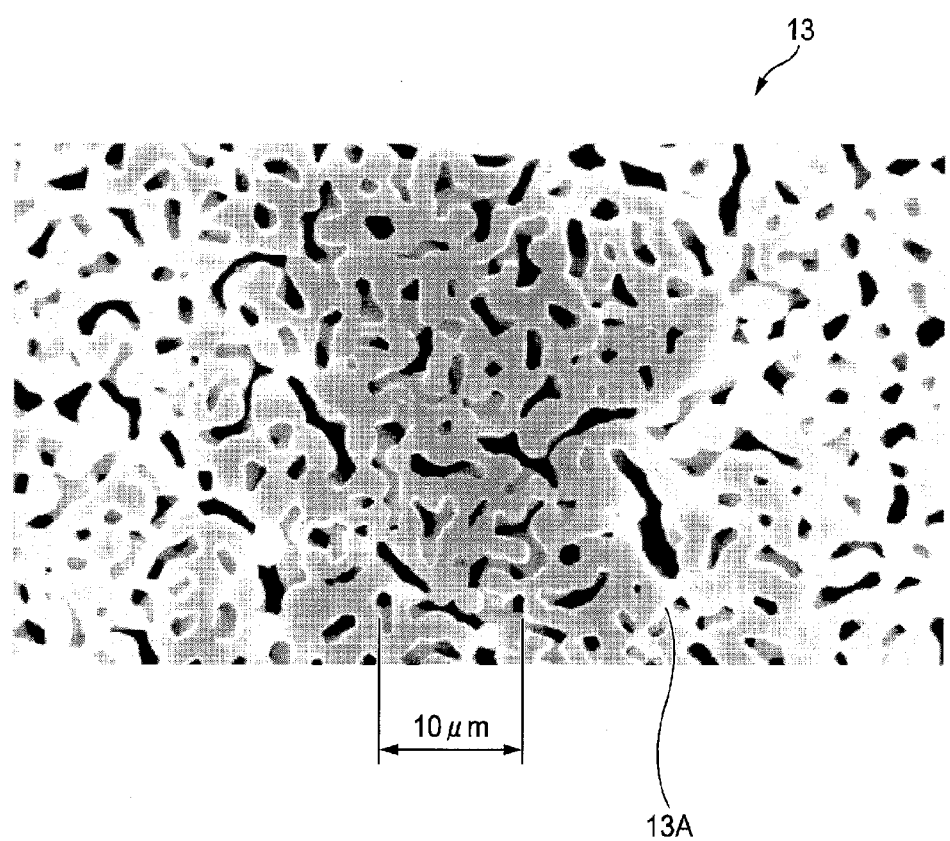
FIG. 6 is an electron microscope photograph showing a non-columnar crystal section (SEM image).

FIG. 6 is an electron microscope photograph of the non-columnar portion 13 taken in a B-B section (section on the base end side in the thickness direction of the non-columnar portion 13) in FIG. 4. In the non-columnar portion 13, the non-columnar crystals 13A each having a smaller diameter than that of the columnar crystal 12A in FIG. 5 are bonded irregularly to each other or are overlapped with each other, and thus a clear void seldom appears between the crystals. The voids in FIG. 6 are smaller in number than the voids in FIG. 5. It is appreciated from the observation results in FIG. 5 and FIG. 6 that a void ratio of the non-columnar portions 13 is lower than a void ratio of the columnar portions 12.

A void ratio of the non-columnar portions 13 is calculated based on a deposition area of the non-columnar portion 13 on the support 11, a thickness of the non-columnar portion 13, a CsI density, an actually measured weight of the scintillator panel, and the like. A total void ratio calculated in such manner in the thickness direction of the non-columnar portion 13 is less than 10%.

The non-columnar portion 13 corresponds to the region that is formed in the initial stage of the vapor deposition on the support 11. A void ratio of the part that contacts a surface of the support 11 in the non-columnar portion 13 becomes 0 or almost 0. The base end portion of the non-columnar portion 13 is adhered closely to the support 11 on its whole contact surface to the support 11.

It is preferable that a thickness of the non-columnar portion 13 should be set thinner than a thickness of the columnar portion 12, and be set to 5 μm or more but 125 μm or less. In order to maintain the adhesion to the support 11, it is preferable that a thickness of the non-columnar portion 13 should be set to 5 μm or more. Also, when a thickness of the non-columnar portion 13 that has no light guiding effect is set too thick, the lights are intermixed between the pixels in the non-columnar portion 13, and thus blurriness of the image is easily caused. Therefore, it is preferable that a thickness of the non-columnar portion 13 should be set to 125 μm or less.

Also, a minimum thickness that enables the non-columnar portion 13 to get adhesion to the support 11 and a light reflecting function will suffice for the thickness of the non-columnar portion 13.

Here, according to the manufacturing conditions, etc., in some cases the non-columnar portion 13 is constructed by not a single layer but laminated plural layers. In such case, a thickness of the non-columnar portion 13 denotes a sum thickness that is added from a surface of the support 11 to a surface of the outermost layer of the non-columnar portion 13.

In the measurement of the crystal diameter in the situation that the adjacent crystals are adhered like the non-columnar portion 13, a line that is set by connecting the recesses (concave portions) produced between the adjacent non-columnar crystals 13A is regarded as a grain boundary between the crystals, then the adhered crystals are separated to form a minimum polygon and then respective crystal diameters are measured, then an average value of the measured crystal diameters is taken in the similar way to that of the diameter of the columnar crystals 12A in the columnar portion 12, and then the value is adopted as the crystal diameter.

From the viewpoint that the effective reflecting characteristic and the adhesion to the support 11 are given to the non-columnar crystal 13A, it is preferable that a diameter of the non-columnar crystal 13A in the non-columnar portion 13 should be kept more than 0.5 μm but less than 7.0 μm. The diameter of the non-columnar crystal 13A is smaller than the diameter of the columnar crystal 12A.

Here, it is preferable that the diameter of the non-columnar crystal 13A should be formed smaller because the substantially spherical crystal shape can be easily maintained. In this case, when the diameter of the non-columnar crystal 13A is excessively smaller, a void ratio comes closer to 0, and thus the non-columnar portion 13 does not fulfill a role of the light reflecting layer. Therefore, it is preferable that the diameter of the non-columnar crystal 13A should be kept more than 0.5 µm. In contrast, when the diameter of the non-columnar crystal 13A is excessively larger, evenness and a void ratio of the non-columnar portion 13 are degraded, and the adhesion to the support 11 is lowered. Also, because the crystals are bonded mutually, a void ratio is decreased and the reflection effect is lessened. Therefore, it is desirable that the crystal diameter of the non-columnar portion 13 should be kept less than 7.0 µm.

A void ratio of the non-columnar portions 13 is calculated based on an area of the non-columnar portion 13 when viewed from the top, a thickness of the non-columnar portion 13, a CsI density, an actually measured weight of the scintillator panel, and the like. A total void ratio calculated in such manner in the thickness direction of the non-columnar portion 13 is less than 10%.

Since such non-columnar portion 13 is formed, the columnar crystal 12A can be grown on a base of the non-columnar portion 13 in such a state that its crystallinity is kept good.

Also, the lights can be emitted from the columnar portion 12 whose crystallinity is kept good, and then the lights that travel toward the opposite side to the sensor portion 40 can be reflected by the non-columnar portion 13 and be caused to input into the sensor portion 40. Therefore, an amount of incident light into the sensor portion is increased, and an available amount of luminescence can be enhanced. A diameter, a thickness, a void ratio, etc. of the non-columnar crystal 13A are decided by taking account of the light reflecting characteristics, adhesion to the support 11, and the like.

Also, like the above first scintillator 10, the second scintillator 20 is constructed to have the columnar portion 12, and the non-columnar portion 13 formed on the base end of the columnar portion 12.

Since the non-columnar portion is provided to the second scintillator 20, the adhesion between the support 21 and the second scintillator 20 is improved. Therefore, the second scintillator 20 can be made it hard to peel off from the support even in the transfer of heat from the control module.

[3-5. Scintillator Manufacturing Method]

It is preferable that the above first and second scintillators 10, 20 should be formed on the surface of the support 11 by the vapor deposition method. Here, explanation will be made by taking the mode using CsI:Tl as an example.

As to the summary of the vapor deposition method, in the environment of a degree of vacuum 0.01 to 10 Pa, CsI as a base material and Tl as an activator are heated and vaporized by the means that feeds an electric power to the resistance heating type crucible, or the like respectively, and then CsI:Tl is deposited on the support by setting a temperature of the support 11 to a room temperature (20° C.) to 300° C.

Here, when the Tl heating temperature is changed by changing an electric power applied to the Tl crucible, a degree of vacuum is changed, or the like, the scintillator whose activator density is different in the crystal growth direction can be formed. For example, an activator density can be enhanced by increasing an electric power applied to the Tl crucible whereas an activator density can be lowered by decreasing an electric power applied to the Tl crucible. In addition, an activator density can be changed by exchanging the type of the activator such as thallium sulfate, thallium oxide, thallium iodide, thallium carbonate, or the like (changing the Tl containing compound). An activator density may be changed by combining the change of the Tl containing compound with the change of a deposition cell temperature. Further, an activator density may be changed by the doping using the ion implantation.

Also, a crystal profile, a crystal diameter, a void ratio, etc. of the first and second scintillators 10, 20 can be controlled by changing a degree of vacuum, a temperature of the support, a deposition rate, or the like.

The above first and second scintillators 10, 20 and the sensor portion 40 are pasted together via the adhesive layer 48. Concretely, the sensor portion 40 is formed on a substrate (not shown) made of Al, glass, or the like, then the first and second scintillators 10, 20 are pasted onto one substrate via the adhesive layer 48, and then the sensor portion 40 is peeled off from the substrate. Then, other scintillator is pasted onto the sensor portion 40 via the adhesive layer 48, and then the protection film 30 is formed. Thus, the X-ray image detection apparatus 1 is manufactured.

In this case, when the moisture-proof of respective scintillators can be attained by other means, for example, when the first and second scintillators 10, 20 are wrapped in an airtight and watertight manner by the moisture-proof film, the protection film 30 may not be formed.

Also, the method of adhering respective scintillators and the sensor portion 40 together is not particularly restricted. Any method may be employed if both members can be optically adhered. As the method of adhering both members together, either of the method of causing both members to oppose directly to each other and adhering them together and the method of causing both members to adhere together via the resin layer may be adopted.

[3-6. Activator Density (Activator Density)]

Figure 7A:
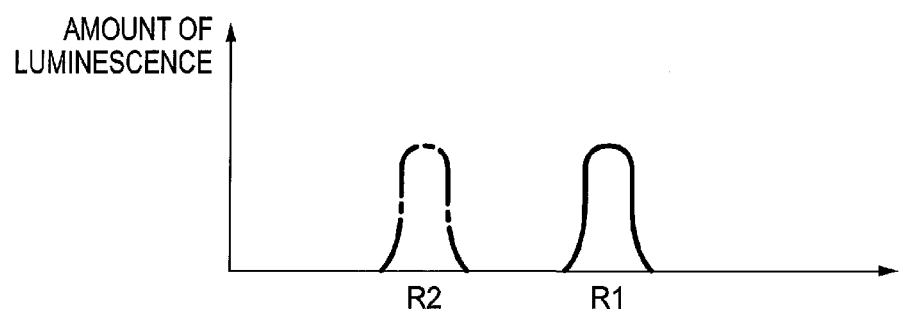
FIG. 7A and FIG. 7B are views showing an activator density and an amount of luminescence of first and second scintillators respectively.
Figure 7B:
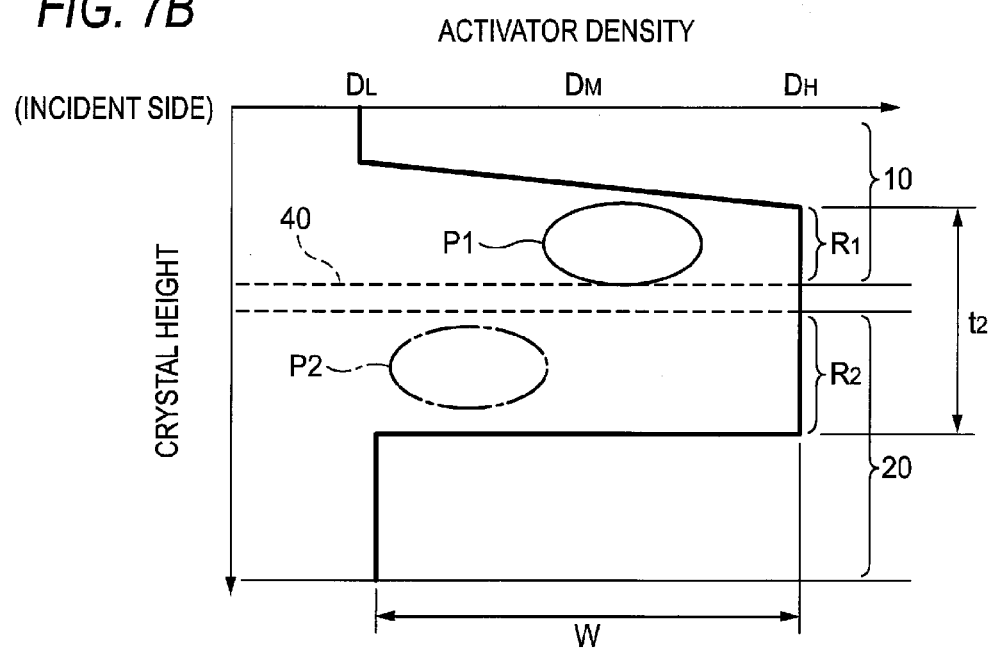

FIG. 7B shows activator density distributions of the first and second scintillators 10, 20. The activator density distributions of the first and second scintillators 10, 20 are changed in sequence of a low density $D_L$, a high density $D_H$, and a low density $D_L$ from the X-ray incident side.

A broken line shown in FIG. 7B indicates the sensor portion 40. The first and second scintillators 10, 20 located on both sides of the sensor portion 40 have a high activator density region $R_1$ and a high activator density region $R_2$, in which an activator density is relatively higher than an activator density on the opposite side to the sensor portion 40 side in the scintillator, in vicinity of the sensor portion 40 respectively. In the example in FIG. 7A and FIG. 7B, the high activator density region is provided to the first and second scintillators 10, 20 respectively. Here, when the high activator density region $R_1$ is provided at least in the first scintillator 10 arranged on the X-ray incident side, the high activator density region $R_2$ may be omitted. In this case, since the first scintillator 10 arranged on the X-ray incident side has a larger X-ray absorbed dose than the second scintillator 20 and has a larger amount of luminescence, it is important to set an activator density of the first scintillator 10 to a high level. Here, thicknesses of the high activator density region $R_1$, $R_2$ are decided appropriately.

In the example in FIG. 7A and FIG. 7B, the activator densities in the high activator density regions $R_1$, $R_2$ are set to the same high density $D_H$, but a different activator density may be set. Also, an activator density in the region that is distant from the sensor portion 40 is set to a low density $D_L$, which is lower than a high density $D_H$, in the first and second scintillators 10, 20 respectively. This low density $D_L$ may be set to 0. That is, the region that is distant from the sensor portion 40 may be formed of CsI into which Tl is not added.

FIG. 7A shows an amount of luminescence every first and second scintillators 10, 20. An amount of luminescence indicated with a solid line in FIG. 7A corresponds to an amount of luminescence in the high activator density region $R_1$ of the first scintillator 10, while an amount of luminescence indicated with a dot-dash line in FIG. 7A corresponds to an amount of luminescence in the high activator density region $R_2$ of the second scintillator 20. A mountain-like profile of an amount of luminescence shown in FIG. 7A indicates a steepness of an amount of luminescence in corresponding widths of parts P1, P2 of the first and second scintillators 10, 20 shown in FIG. 7B respectively. Both activator densities of these parts P1, P2 show the high density $D_H$ regardless of the abscissa in FIG. 7B.

Figure 14:
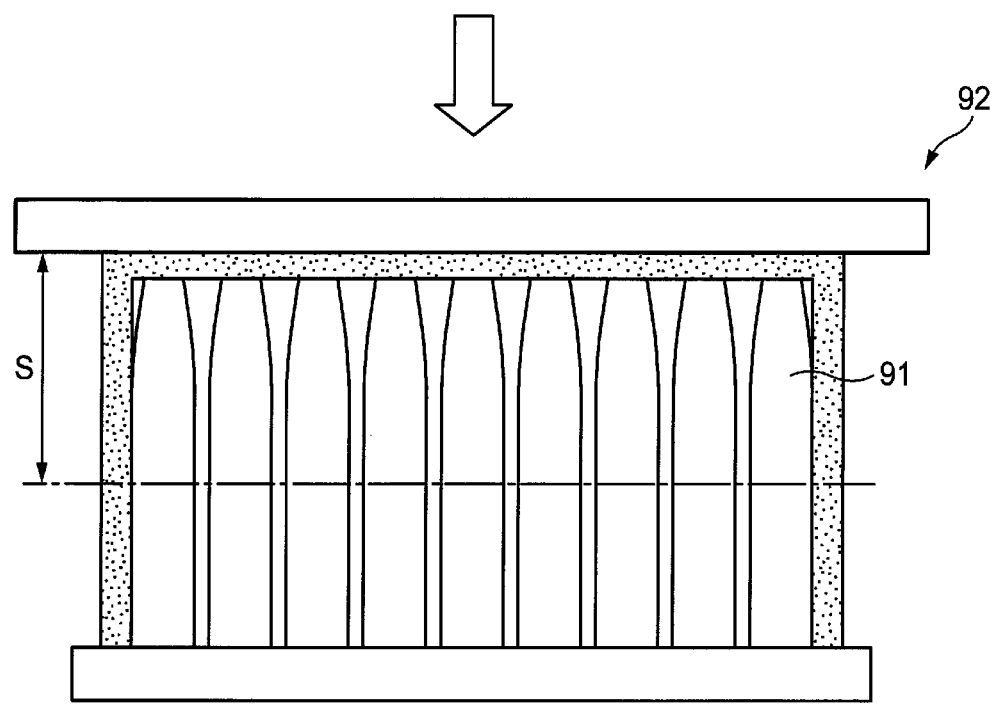
FIG. 14 is aside sectional view showing schematically a schematic configuration of an X-ray image detection apparatus.
Figure 15A:
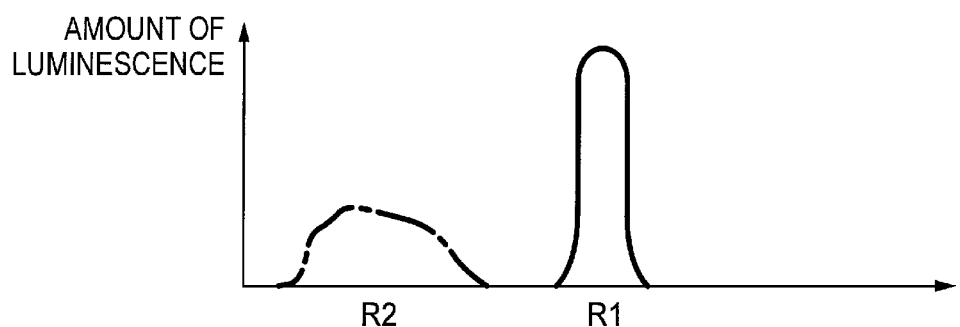
FIG. 15A and FIG. 15B are views showing an activator density and an amount of luminescence of a scintillator in the configuration in FIG. 14.

Here, in the comparison between FIG. 15A and FIG. 7A showing an activator density distribution respectively in the case where only one scintillator is employed (FIG. 14), it is appreciated that an amount of luminescence in the part that is distant from an X-ray incident plane of the scintillator in FIG. 7A (an amount of luminescence indicated with a dot-dash line in FIG. 7A) is larger and steeper than an amount of luminescence in the same part in FIG. 15A (an amount of luminescence indicated with a dot-dash line in FIG. 15A). Also, respective amounts of luminescences indicated with a solid line and a dot-dash line in FIG. 7A (concerning to the parts P1, P2) are substantially equal, and also respective steepnesses show substantially the similar profile.

Figure 15B:
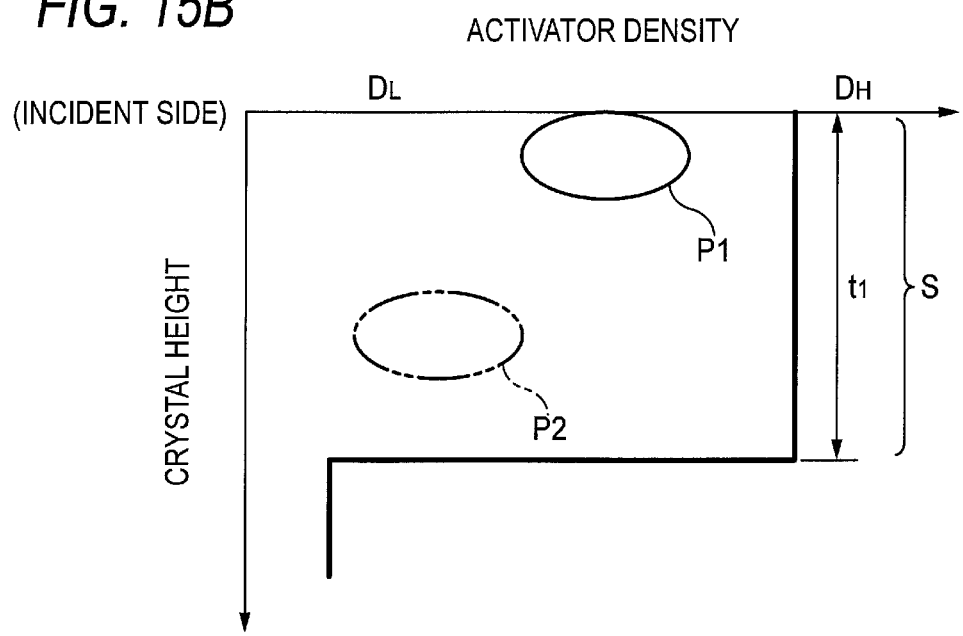

Since an activator density is set to the high activator density on the X-ray incident side in the scintillator configuration in FIG. 15A, an amount of luminescence indicated with a solid line in FIG. 7A is smaller than an amount of luminescence indicated with a solid line in FIG. 15A. In contrast, a total amount of luminescence obtained by adding an amount of luminescence indicated with a dot-dash line and an amount of luminescence indicated with a solid line (corresponding to the parts P1, P2) in FIG. 7A and FIG. 7B is larger than that in FIG. 15A and FIG. 15B. In other words, a thickness $t_2$ of all scintillators (a total thickness of the first and second scintillators) can be set smaller than a thickness $t_1$ of the scintillator needed when only one scintillator is used (FIG. 15A and FIG. 15B). Therefore, a reduction in thickness can be facilitated, and also a reduction in cost can be attained by reducing the used amount of expensive fluorescent material. Besides, according to the activator density distribution in FIG. 15A and FIG. 15B, MTF can be improved because steepness of the amount of luminescence obtained when the parts P1, P2 are considered together is improved.

Here, when the high activator density region $R_2$ is not provided in the second scintillator 20, i.e., when an activator density in the part P2 of the second scintillator 20 is low or 0, the amount of luminescence at that time becomes smaller than a amount of luminescence indicated with a dot-dash line in FIG. 7A. In such case, a total amount of luminescence obtained by adding the amount of luminescence and an amount of luminescence in the part P1 (a solid line in FIG. 7A) can also be increased larger than that in the case in FIG. 15A and FIG. 15B.

The high activator density regions $R_1$, $R_2$ are defined more concretely as follows. That is, the high activator density regions $R_1$, $R_2$ correspond to the regions where the activator density is higher than an activator density half value $D_M$, which corresponds to ½ of a change width (activator density change width) W of the activator density that changes in the thickness direction (crystal growth direction) in the first and second scintillators 10, 20, respectively.

Here, the high activator density regions $R_1$, $R_2$ are given as a mere illustration of the high activator density region respectively. In respective scintillators, the high activator density region and the region where an activator density is low are not always grasped as the regions that divide the scintillator into two parts in the height direction. The case where a plurality of regions in which an activator density is different respectively are grasped may be considered.

Also, a concrete activator density distribution is not restricted as far as an activator density in vicinity of the sensor portion 40 is kept high. In the activator density distribution of the first scintillator 10 in FIG. 7B, an activator density may has no gradient and may be changed discontinuously. Otherwise, an activator density may has a gradient stepwise or linearly and may be changed in the crystal height direction. In this case, the region where the activator density is higher than the activator density half value $D_M$, for example, can also be grasped as the high activator density region.

As the above sensor portion 40, the support for each scintillator, etc., for example, OPC (Organic Photoelectric Material), organic TFT, TFT using an amorphous oxide (e.g., a-IGZO), flexible material (aramid, bionanofiber), and the like can be used. These device related materials will be described later.

[4. Operations and Effects of Activator Density]

According to the X-ray image detection apparatus 1 explained above, following operations and effects can be obtained.

In the first and second scintillators 10, 20 that are arranged on both sides of the sensor portion 40, since the activator density in vicinity of the sensor portion 40 is enhanced (the high activator density regions $R_1$, $R_2$), an increase in a amount of luminescence from the part in vicinity of the sensor portion 40 of the second scintillator 20, which is located away from the X-ray incident plane 11A, and suppression of the spread of light emission can be implemented. Therefore, in the configuration that the scintillator is irradiated with the X ray from the X-ray incident side and the sensor portion 40 side, an amount of luminescence can be enhanced further, in addition to the enhancement of an activator density in the main luminescence region on the X-ray incident side of the scintillator (FIG. 14). Accordingly, since an available amount of luminescence incident on the sensor portion 40 is increased, detectivity can be improved. In addition, since a degree of steepness of the light emitting distribution in the second scintillator 20 that is away from the X-ray incident plane 11A is improved, MTF can be improved much more than the case in FIG. 14. As a result, sharpness of the detected image can be improved.

Also, commonly the crystallinity is prone to fall into disorder when an activator density is increased. However, because the region in which an activator density is high is located on the top end side of the columnar crystal 12A, the disorder of the crystallinity can be suppressed in the initial growth phase of the columnar crystal 12A in contrast to the case where an activator density is high, and the worsening of MTF can be suppressed.

Suppose an activator density is high on the supports 11,21 sides respectively, the disorder of the crystallinity in the deposition initial phase exerts a serious influence upon the crystallinity of the high activator density regions $R_1$, $R_2$ that are grown later. Light diffusion and absorption are caused in the portion where the crystallinity is disordered, which yields the worsening of MTF. In contrast, in the present configuration, an activator density is low on the supports 11, 21 sides, but an activator density is high on the top end side of the columnar crystal 12A (the high activator density regions $R_1$, $R_2$). Therefore, the crystals can be grown while maintaining the crystallinity, and thus the light guiding effect can be maintained over the substantially whole range in the height direction of the columnar crystal 12A. Accordingly, the worsening of MTF can be suppressed.

As explained above, according to the X-ray image detection apparatus 1, further improvement of an amount of luminescence and MTF can be achieved in the configuration that the first and second scintillators 10, 20 are arranged on both sides of the sensor portion 40. According to such X-ray image detection apparatus 1, the X-ray image can be detected in a high sensitivity and a high definition.

In the X-ray image detection apparatus 1 shown in FIG. 1, a pulse-like activation density distribution shown in FIG. 9 described later may be applied. Accordingly, the worsening of MTF caused due to the disorder of the crystallinity can be suppressed. Also, since an activation density in the part that is located closest to the sensor portion 40 is set to a low density $D_L$ in the pulse-like activation density distribution, strength of the top end portion of the columnar crystal 12A can be maintained. Since the strength of the top end portion of the columnar crystal 12A can be ensured, the damage of the scintillator when the scintillators are pasted together or when the scintillator panel is subjected to a load can be prevented, and a load capacity of the scintillator panel can be increased.

[5. X-Ray Image Detection Apparatus in Other Modes]

Next, X-ray image detection apparatuses 2 to 4 (FIG. 8, FIG. 10, and FIG. 11) having a different configuration from the X-ray image detection apparatus 1 shown in FIG. 1 respectively will be explained hereunder. These X-ray image detection apparatuses 2 to 4 can be equipped with the similar configurations to detailed configurations of the above X-ray image detection apparatus 1, and accordingly the similar operations and effects to those described in the X-ray image detection apparatus 1. Also, various sensor portions and various device materials, described later, can be employed in the X-ray image detection apparatuses 2 to 4.

Figure 8:
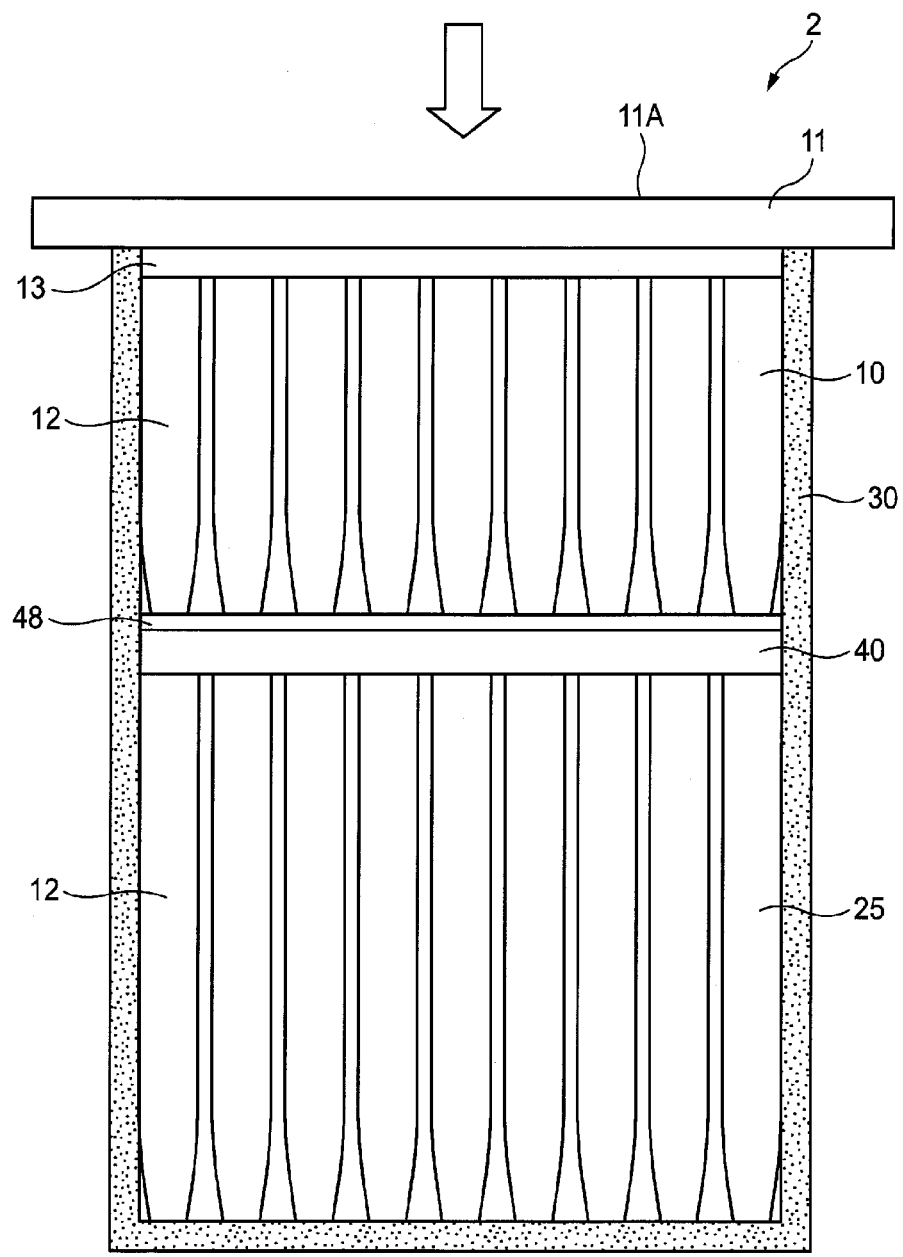
FIG. 8 is a side sectional view showing schematically a schematic configuration of an X-ray image detection apparatus.

FIG. 8 shows another example of the X-ray image detection apparatus to explain an embodiment of the present invention.

A second scintillator 25 of the X-ray image detection apparatus 2 is deposited not on the support 21 as the deposition substrate (FIG. 1) but on the sensor portion 40. That is, the second scintillator 25 is formed by growing the columnar crystals 12A on the sensor portion 40 before the sensor portion 40 is peeled off from the substrate.

In this case, the above non-columnar portion 13 (FIG. 4) may be formed between the sensor portion 40 and the columnar portion 12 in the second scintillator 25.

Here, the deposition substrate of the sensor portion 40 is peeled off and removed from the sensor portion 40 at any rate. Hence, there is no necessity to use a transparent substrate such as glass, or the like as the deposition substrate of the sensor portion 40, and a metal deposition substrate can be employed. Because it is impossible to say that adhesion of CsI to the glass whose thermal conductivity is low, or the like is good, adhesion of the second scintillator 25 to the sensor portion 40 can be improved by depositing the scintillator on the sensor portion that is formed on the metal deposition substrate.

The activation density distributions of the first and second scintillators shown in FIG. 7B can also be applied to the X-ray image detection apparatus 2 in FIG. 8. That is, as shown in FIG. 7B, the first and second scintillators may have the high activator density regions $R_1$, $R_2$ respectively.

Figure 9:
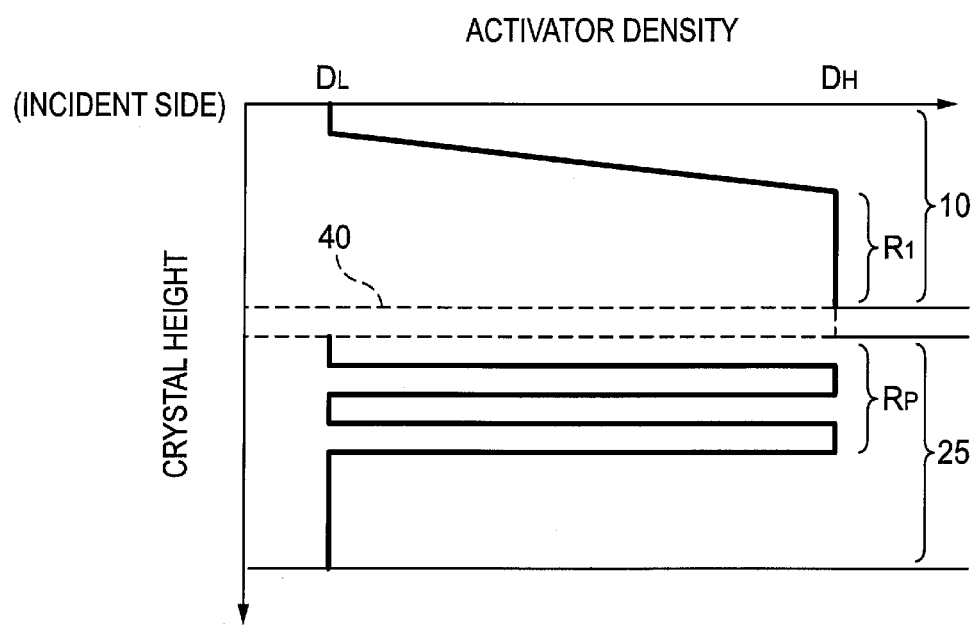
FIG. 9 is a view showing activator densities of the first and second scintillators suitable for the configuration in FIG. 8.

FIG. 9 shows activator densities, which are more preferable than those in FIG. 7A and FIG. 7B, in the X-ray image detection apparatus 2 in FIG. 8. As shown in FIG. 9, the second scintillator 25 has a pulse-like activator density region $R_P$, in which an activation density is increased/decreased like a repetitive pulse, in the vicinity of the sensor portion 40. In the pulse-like activator density region $R_P$, an activation density is changed repeatedly once or more between the high density $D_H$ and the low density $D_L$. It is preferable that the activation density in the position that is closest to the sensor portion 40 set in the pulse-like activator density region $R_P$ should be the low density $D_L$.

In the second scintillator 25, the initial part of the crystal growth is the region where an activation density is high, and thus the disorder of the crystallinity is ready to conspicuous when an activation density is increased. For this reason, as shown in FIG. 9, when the pulse-like activation applied in such a way that an activation density is repeated once or more between the high density and the low density is done, improvement of an amount of luminescence and MTF can be achieved effectively in the high density part while suppressing the disorder of the crystallinity.

In addition to the mode shown in FIG. 8, the repetitive pulse in which at least one of the high and low value of the pulse is gradually increased and gradually decreased may be employed. Alternately, a waveform such as a triangular waveform, a sawtooth waveform, or the like may be employed.

Here, since an activator density is low in the position that is closest to the sensor portion 40, like the activator density distribution of the second scintillator 25 shown in FIG. 9, such an advantage can be obtained that the strength of the scintillator can be improved. That is, according to the increase of the activator density, an amount of luminescence can be increased, nevertheless the disorder of the cristallinity is caused and thus strength of the part in which the cristallinity is disordered is lowered. Therefore, it feared that the top end portion of the columnar crystal 12A is damaged when the scintillator is pasted onto the sensor portion 40 or when the scintillator panel is subjected to a load. For this reason, the strength of the top end portion of the columnar crystal 12A can be maintained by decreasing the activator density near the sensor portion 40. Accordingly, a load capacity of the X-ray image detection apparatus can be increased, and an impact resistance can be improved. In particular, such an advantage can be achieved that, when the X-ray image detection apparatus is pasted onto the housing such as the cassette top plate, or the like, the scintillator is seldom damaged even though the scintillator is subjected to a load from the housing.

Also, since moisture absorbency resistance of CsI is lowered by the Tl activation, it is feared that performance degradation of the scintillator is begun in such a situation that the sealing performance of the scintillator is lowered by the protection film 30 and the sensor portion 40 at a time of manufacture or use. Also, since an activator density at the end of the second scintillator 25 is set low, the end portion of the second scintillator 25 can keep the moisture absorbency resistance even when the sealing performance is lowered, and therefore the performance degradation of the scintillator can be suppressed (the degradation can be delayed). As the causes of deterioration in the sealing performance, various causes may be considered such that the protection film 30 is torn at a time of adhesion, the scintillator is broken in other times because the top end portion of the columnar crystal 12A is made narrow, the moisture absorbency resistance is lowered at the part where the protection film 30 is partially peeled off from the sensor portion 40 by the impact, or the like, etc. Also, the fact that sensor portion 40 is peeled off from the substrate corresponds to the main cause of deteriorating the sealing performance of the scintillator. In this case, the scintillator can hold the moisture absorbency resistance against the moisture that is ready to seep in the scintillator through the sensor portion 40, and therefore degradation of the performance can be suppressed.

In this event, it is preferable that the part of the end portion, around which the activation density is to be lowered, of the scintillator (here, the top end portion of the columnar crystal 12A) should be formed thin in such a thickness that the strength that withstand a load when the scintillator is pasted, when the load is applied from the outside, or the like can be ensured and the moisture absorbency resistance can be maintained. It is preferable that a thickness of the part around which the activation density is to be lowered should be less than 50 μm. When a thickness can be made thin in this way, attenuation, diffusion, etc. of lights in the concerned part can be neglected. Also, it is preferable that a thickness of the concerned part should be set in excess of 5 μm with regard to insurance of the strength.

Since the strength of the scintillator can be ensured, the scintillator is never damage even when such scintillator is strongly pushed against the sensor portion upon pasting the sensor portion. Thus, the scintillator and the sensor portion 40 can be uniformly adhered together via the protection film 30. When unevenness in adhesion between the scintillators and the sensor portion 40 shows up, unevenness is ready to appear in the detected image. But such situation can be eliminated, and picture quality of the detected image can be uniformized.

Upon manufacturing the X-ray image detection apparatus 2 in FIG. 8, the sensor portion 40 and the second scintillator 25 are formed sequentially on a substrate (not shown). Then, the sensor portion 40 is peeled off from the substrate. In this case, it is preferable that, prior to the peeling, a supporting member (not shown) made of Al, plastics, or the like should be pasted on the end portion (the top end portion of the columnar portion 12) on the opposite side to the sensor portion 40 of the second scintillator 25. Since a distance between the columnar crystals 12A can be maintained by this supporting member, it can be prevented that the columnar crystals 12A are damaged by their mutual contact when the sensor portion 40 is peeled off from the substrate. After the substrate is peeled off/removed from the sensor portion 40, and the first scintillator 10 and the sensor portion 40 are pasted together via the adhesive layer 48. Then, the supporting member is removed, and then the first and second scintillators 10, 25 are sealed on the support 11 by forming the protection film 30. Thus, the X-ray image detection apparatus 2 is manufactured.

As described above, the time and labor required for the separate use of the supporting member at a time of peeing the substrate are not needed in manufacturing the X-ray image detection apparatus 1 shown in FIG. 1. Hence, the configuration in FIG. 1 is more advantageous than the configuration in FIG. 8 from this respect.

Also, in comparison between respective X-ray image detection apparatuses 1, 2 in FIG. 1 and FIG. 8, the configuration that the top end portions of the columnar crystals 12A whose crystallinity is good are opposed to the sensor portion 40, as shown in FIG. 1, is advantageous in that how an amount of luminescence in the main luminescence region in vicinity of the sensor portion 40 should be increased. In particular, since the lack of X-ray incident dose caused by the distant location of the scintillator from the X-ray incident plane 11A can be compensated, such a configuration is preferable with regard to the photoelectric conversion performance (in a sense of attaining an increase of a amount of luminescence) that the second scintillator 20 should be formed on the support 11 such that, as shown in FIG. 1, the neighborhood of the sensor portion 40 in the second scintillator 20 that is distant from the X-ray incident plane 11A is positioned at the top end portion of the columnar crystal 12A.

Figure 10:
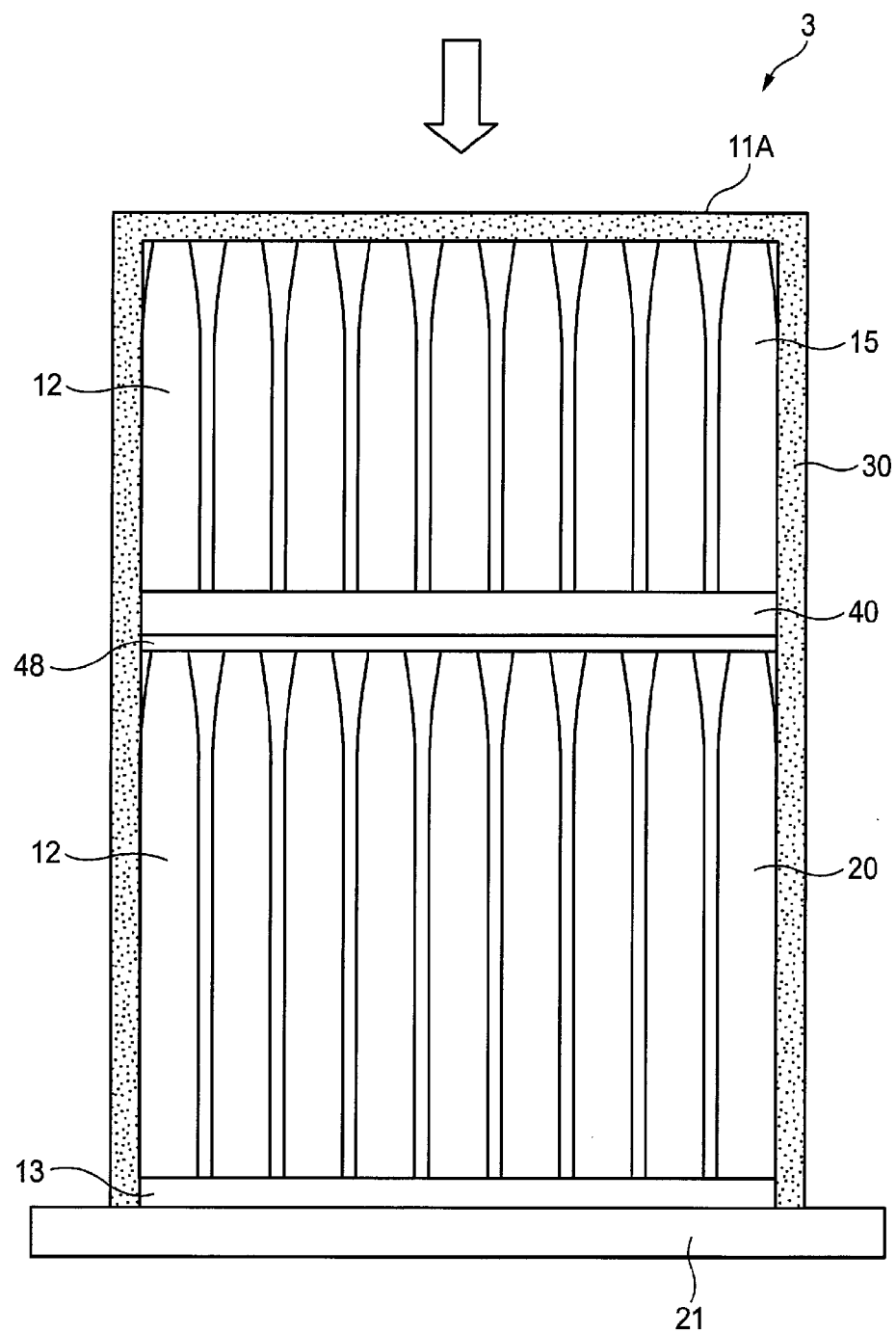
FIG. 10 is a side sectional view showing schematically a schematic configuration of an X-ray image detection apparatus.

FIG. 10 shows still another example of the X-ray image detection apparatus to explain the embodiment of the present invention. In the X-ray image detection apparatus 3, a first scintillator 15 is formed on the sensor portion 40 is formed by the vapor deposition, on the contrary to the X-ray image detection apparatus 2 in FIG. 8.

The activator density distribution in FIG. 7A and FIG. 7B can also be applied to the X-ray image detection apparatus 3 in FIG. 10. It is preferable that the region where the activator density is changed in the pulse-like form, like the pulse-like activator density region $R_P$ in FIG. 9, should be provided in vicinity of the sensor portion 40 of the first scintillator 15, in place of the high activator density region $R_1$ in FIG. 7A and FIG. 7B.

The configuration of the X-ray image detection apparatus 3 in FIG. 10 and the method of manufacturing the same can be explained by exchanging the first scintillator and the second scintillator in the explanation about the X-ray image detection apparatus 2 in FIG. 8.

In comparison between respective X-ray image detection apparatuses 1, 3 in FIG. 1 and FIG. 10, the configuration in FIG. 1 is advantageous in that the time and labor required for peeling the substrate are not needed.

Also, in comparison between respective X-ray image detection apparatuses 1, 2 in FIG. 8 and FIG. 10, the first scintillator 10 is deposited directly in FIG. 10, and thus the crystallity in the part which is located in vicinity of the sensor portion 40 in the first scintillator 10 and whose activator density is high is bad. In contrast, activator density at the top end portion of the columnar crystal whose crystallity is good in the first scintillator 10 is high in FIG. 8, and thus the configuration in FIG. 10 is advantageous in that MTF can be improved.

Figure 11:
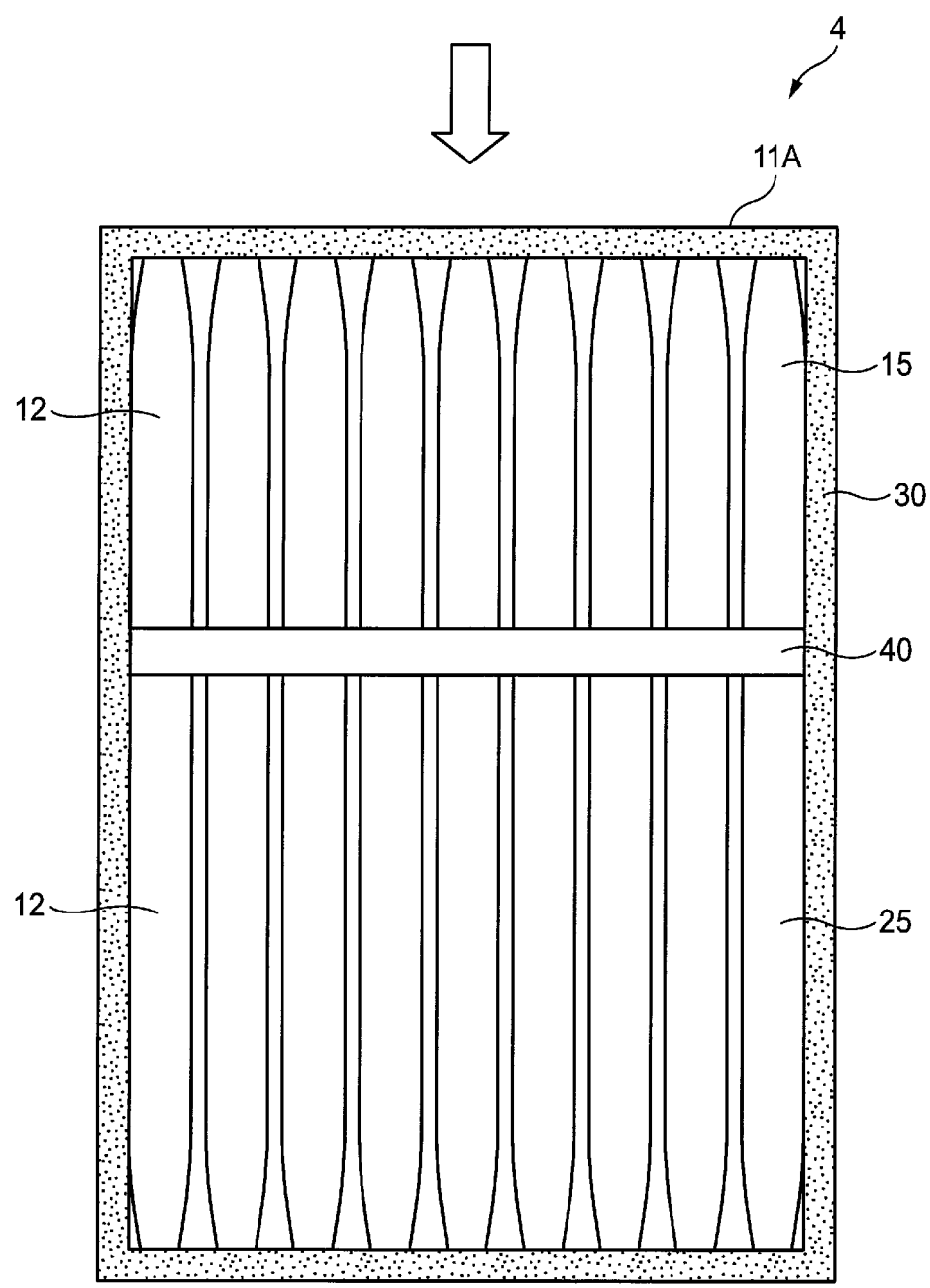
FIG. 11 is a side sectional view showing schematically a schematic configuration of an X-ray image detection apparatus.

FIG. 11 shows yet another example of the X-ray image detection apparatus to explain the embodiment of the present invention. In the X-ray image detection apparatus 4, both the first and second scintillators 15, 25 are formed on the sensor portion 40 by the vapor deposition. The activator density distribution in FIG. 7A and FIG. 7B can also be applied to this X-ray image detection apparatus 4. It is preferable that the pulse-like activator density region $R_P$ shown in FIG. 9 should be provided in both the first and second scintillators 15, 25.

In manufacturing the X-ray image detection apparatus 4 in FIG. 11, the sensor portion 40 and the second scintillator 25 are formed sequentially on a substrate (not shown). Then, it is preferable that a supporting plate (not shown) made of Al, plastics, or the like should be pasted on the end portion of the second scintillator 25 on the opposite side to the sensor portion 40 (the top end portions of the columnar portions 12) to support the columnar crystals 12A, and then the sensor portion 40 should be peeled off from the substrate. After the substrate is peeled off, the first scintillator 15 is deposited on the sensor portion 40, then the supporting member is removed, and then the protection film 30 is formed by the vapor deposition. Thus, the X-ray image detection apparatus 4 is manufactured.

[6. Variations of Sensor Portion]

Figure 12:
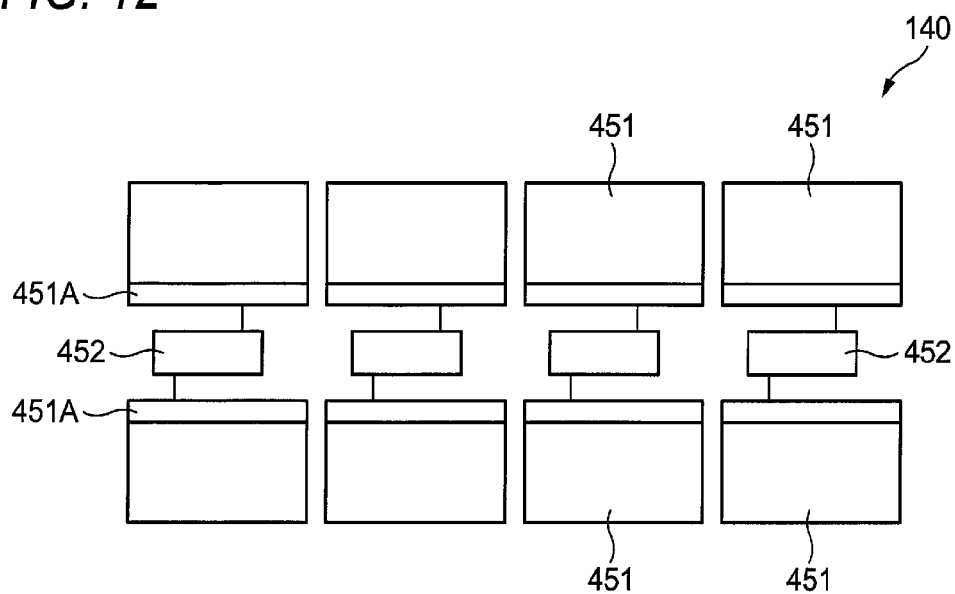
FIG. 12 is a schematic view showing a variation of the sensor portion.

FIG. 12 shows another sensor portion 140 that can be replaced with the sensor portion 40 shown in FIG. 2. The sensor portion 140 includes a plurality of TFTs 452 each of which is assigned to one pixel, and a plurality of PDs 451 two of which are arranged on both sides of the TFT 452 in the thickness direction respectively, and is constructed by stacking the PDs 451, the TFTs 452, and the PDs 451. Because the PDs 451 and the TFTs 452 are stacked in this manner, a distance between the first and second scintillators on both sides of the sensor portion 140 can be shortened. The distance between the first and second scintillators is kept less than 40 μm, as described above.

In the configuration in FIG. 2, the PDs 41 and the TFTs 42 are arranged on the same plane or the substantially same plane, and the lights are incident on each of the PDs 41 from both the first and second scintillators 10, 20. In contrast, in the configuration in FIG. 12, each of the PDs 451, 451 is provided in the X-ray traveling direction on both sides of the TFT 452, and therefore the lights emitted from the first scintillator are incident on one PD451 provided on the first scintillator side whereas the lights emitted from the second scintillator are incident on the other PD451. Because the PD 451 in FIG. 12 can keep a light receiving surface more widely than the PD41 in FIG. 2, an amount of incident light on the PD can be increased and also a light collecting efficiency can be improved.

Also, each of the PDs 451, 451 has a light reflecting layer 451A on the TFT 452 side, and accordingly a switching noise of the TFT 452 can be reduced.

Also, the TFT formed of an amorphous oxide semiconductor (a-IGZO) can be used in both the sensor portion 40 in FIG. 2 and the sensor portion 140 in FIG. 12. The a-IGZO has a sensitivity in a wavelength of 350 nm or more, and the a-IGZO seldom has a sensitivity in the visible light range. Thus, the light reflecting layer can be neglected.

Figure 13:
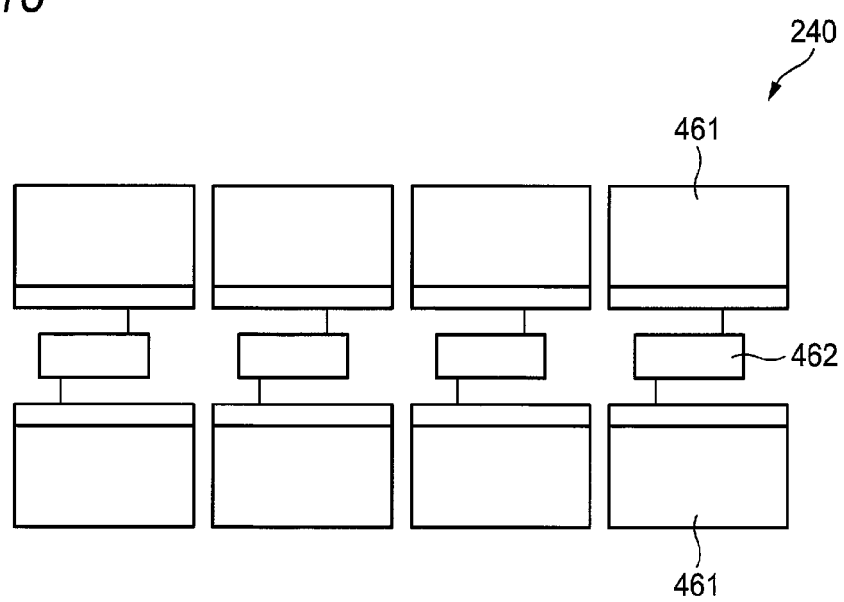
FIG. 13 is a schematic view showing another variation of the sensor portion.

Also, the organic material can be employed as the PD and the TFT. FIG. 13 shows photoelectric conversion elements 461 each formed of the OPC (organic photoelectric material), and TFTs 462 each formed of the organic material. The sensor portion 40 shown in FIG. 2 can also be replaced with a sensor portion 240 that has the photoelectric conversion elements 461 and the TFTs 462.

The X-ray absorption is hardly caused by the organic material used as the photoelectric conversion elements 461 and the TFTs 462. Therefore, an amount of X rays that pass through the photoelectric conversion elements 461 and the TFT 462 and reach the second scintillator can be increased. Here, in the case where the CsI:Tl that emits green lights is used as the scintillator, quinacrine is used as the OPC of the photoelectric conversion elements 461, and the transparent organic material of the TFT is formed of a phthalocyanine compound in Chemical Formula 1, a naphthalocyanine compound in Chemical Formula 2, or the like set forth in JP-A-2009-212389, for example, the switching noise of the TFT is seldom produced even when the light reflecting layer is not provided unlike FIG. 13. When the light reflecting layer is not provided, in some cases the lights leak out from the photoelectric conversion elements 461 arranged on the first scintillator side to the second scintillator side. In this event, since most of the leaked lights are incident on the photoelectric conversion elements 461 that correspond to the same pixels on the second scintillator side, no problem arises.

In FIG. 13, an example in which the photoelectric conversion element 461 is arranged on both sides of the TFT respectively is illustrated. As shown in FIG. 2, the photoelectric conversion elements 461 and the TFTs 462 may be arranged on the same plane or the substantially same plane.

[7. Energy Subtraction Photographic Panel]

By the way, an energy subtraction photographic panel can be constructed by using two scintillators. In this case, the first and second scintillators are constructed by the fluorescent materials whose sensitivity (K absorption edge and emission wavelength) to the radiation X is different mutually. Concretely, the first scintillator picks up a low voltage image of the soft parts tissue that is represented by a low energy radiation out of the radiations that passed through the subject. Hence, the first scintillator is constructed by the fluorescent material whose radiation absorptance μ has no K absorption edge in the high energy part, i.e., whose radiation absorptance μ is never increased discontinuously in the high energy part. Also, the second scintillator picks up a high voltage image of a hard parts tissue that is represented by a high energy radiation out of the radiations that passed through the subject. Hence, the second scintillator is constructed by the fluorescent material whose radiation absorptance μ is made higher than the fluorescent material used in the first scintillator in the high energy part.

Here, the "soft parts tissue" contains muscles, internal organs, etc., and denotes the tissue other than bone tissues such as a cortical bone and/or a sponge bone, etc. Also, the "hard parts tissue" is called a hard tissue, and denotes the bone tissue such as a cortical bone and/or a sponge bone, etc.

The fluorescent materials used as the first and second scintillators respectively can be appropriately chosen from all materials that are commonly used as the scintillator if the fluorescent materials have different sensitivities to the radiation energy mutually. For example, the materials can be chosen from the fluorescent materials listed in a Table 1 given hereunder. In this case, from the viewpoint that a distinction between the low voltage image and the high voltage image being obtained by the photography is made clear, it is preferable that the fluorescent materials used as the first and second scintillators respectively should be different not only in the sensitivity to the radiation but also in the luminous color mutually.

TABLE 1

| Composition | Luminous color | Wavelength [nm] | K absorption end [eV] |
|---|---|---|---|
| $HfP_2O_7$ | ultraviolet | 300 | 65.3 |
| $YtaO_4$ | ultraviolet | 340 | 67.4 |
| $BaSO_4$:Eu | violet | 375 | 37.4 |
| BaFCl:Eu | violet | 385 | 37.4 |
| BaFBr:Eu | violet | 390 | 37.4 |
| $YtaO_4$:Nb | blue | 410 | 67.4 |
| CsI:Na | blue | 420 | 36/33.2 |
| $CaWO_4$ | blue | 425 | 69.5 |
| ZnS:Ag | blue | 450 | 9.7 |
| LaOBr:Tm | blue | 460 | 38.9 |
| $Bi_4Ge_3O_{12}$ | blue | 480 | 90.4 |
| $CdSO_4$ | bluish green | 480 | 27/69.5 |
| LaOBr:Tb | bluish white | 380, 415, 440, 545 | 38.9 |
| $Y_2O_2S$:Tb | bluish white | 380, 415, 440, 545 | 17.03 |
| $Gd_2O_2S$:Pr | green | 515 | 50.2 |
| (Zn,Cd)S:Ag | green | 530 | 9.7/27 |
| CsI:Tl | green | 540 | 36/33.2 |
| $Gd_2O_2S$:Tb | green | 545 | 60.2 |
| $La_2O_2S$:Tb | green | 545 | 38.9 |

Here, in addition to the fluorescent materials in Table 1, CsBr:Eu, ZnS:Cu, $Gd_2O_2S$:Eu, $Lu_2O_2S$:Tb, etc. can be chosen.

In this case, from the viewpoint that high picture quality can be obtained, it is preferable that the fluorescent material whose base material constituting the columnar structure is formed of CsI or CsBr should be chosen from the above. In particular, the high picture quality that enables the fine parts of the soft parts tissue to represent satisfactorily is required of the low voltage image. Therefore, it is more preferable that the first scintillator should be formed of the fluorescent material that allows the first scintillator to get the columnar structure. Concretely, when the first scintillator is formed to have the columnar structure, the lights being converted by the first scintillator can travel through the columnar structure while reflecting at the boundaries between the columnar structures, and thus the light scattering can be reduced. Accordingly, an amount of received light of the PD 41 is increased, and hence the low voltage image of high picture quality can be obtained.

Also, from the viewpoint that no noise should be produced in the picked-up radiographic image without the provision of the color filter that absorbs the lights having a predetermined wavelength (shields the lights), the fluorescent material that emits the light having a not-broad and sharp wavelength (luminous wavelength is narrow) is preferable among the above materials, except CsI:Tl, (Zn,Cd)S:Ag, CaWO$_4$:Pb, La$_2$Obr:Tb, ZnS:Ag, and CsI:Na. As the fluorescent material that emits the light having such sharp wavelength, for example, Gd$_2$O$_2$S:Tb and La$_2$O$_2$S:Tb both emitting the green light, and BaFX:Eu emitting the blue light (where, X denotes a halogen element such as Br, Cl, or the like) can be listed. Among them, particularly a combination of the BaFX:Eu emitting the blue light and the Gd$_2$O$_2$S:Tb emitting the green light is preferable, as a combination of the fluorescent materials used in the first and second scintillators.

When the energy subtraction photographic panel is constructed, the sensor portion (e.g., the PD and the TFT) is provided to every first and second scintillators between the first and second scintillators. Then, in order to avoid such a situation that respective emitted lights of the first and second scintillators are mixed, a light shielding layer is provided between the PDs of the first scintillators and the PDs of the second scintillator.

Here, in the first and second scintillators used in the energy subtraction photographic panel, the similar advantages to those mentioned above can be achieved by providing the above configuration, e.g., the configuration that relates to the change of the activator density. When the above X-ray image detection apparatus is constructed as the energy subtraction photographic panel, both the low voltage image of the soft parts tissue, which is represented by the radiation of low energy out of the radiation that passed through the subject, and the high voltage image of the hard parts tissue, which is represented by the radiation of high energy, can be detected with high precision.

[8. Available Device Material]

[8-1. OPC (Organic Photoelectric Conversion) Material]

For example, any OPC (Organic Photoelectric Conversion) material disclosed in JP-A-2009-32854 can be used for the aforementioned PDs 41 (FIG. 2). A film formed out of the OPC material (hereinafter referred to as OPC film) can be used as the photoconductive layer 410 of the PDs 41. The OPC film contains an organic photoelectric conversion material, which absorbs light emitted from the scintillator and generates electric charges corresponding to the absorbed light. Thus, the OPC film containing the organic photoelectric conversion material has a sharp absorption spectrum in a visible light range. Electromagnetic waves other than the light emitted by the scintillator are hardly absorbed by the OPC film. Thus, noise generated by radioactive rays such as X-rays absorbed by the OPC film can be suppressed effectively.

It is preferable that the absorption peak wavelength of the organic photoelectric conversion material forming the OPC film is closer to the peak wavelength of light emitted by the scintillator in order to more efficiently absorb the light emitted by the scintillator. Ideally, the absorption peak wavelength of the organic photoelectric conversion material agrees with the peak wavelength of the light emitted by the scintillator. However, if the difference between the absorption peak wavelength of the organic photoelectric conversion material and the peak wavelength of the light emitted by the scintillator is small, the light emitted by the scintillator can be absorbed satisfactorily. Specifically, the difference between the absorption peak wavelength of the organic photoelectric conversion material and the peak wavelength of the light emitted by the scintillator in response to radioactive rays is preferably not larger than 10 nm, more preferably not larger than 5 nm.

Examples of the organic photoelectric conversion material that can satisfy such conditions include arylidene-based organic compounds, quinacridone-based organic compounds, and phthalocyanine-based organic compounds. For example, the absorption peak wavelength of quinacridone in a visible light range is 560 nm. Therefore, when quinacridone is used as the organic photoelectric conversion material and CsI(Tl) is used as the fluorescent material, the aforementioned difference in peak wavelength can be set within 5 nm so that the amount of electric charges generated in the OPC film can be increased substantially to the maximum.

At least a part of an organic layer provided between the bias electrode and the charge collection electrode of PD 41 can be formed out of an OPC film. More specifically, the organic layer can be formed out of a stack or a mixture of a portion for absorbing electromagnetic waves, a photoelectric conversion portion, an electron transport portion, an electron hole transport portion, an electron blocking portion, an electron hole blocking portion, a crystallization prevention portion, electrodes, interlayer contact improvement portions, etc.

Preferably the organic layer contains an organic p-type compound or an organic n-type compound. An organic p-type semiconductor (compound) is a donor-type organic semiconductor (compound) as chiefly represented by an electron hole transport organic compound, meaning an organic compound having characteristic to easily donate electrons. More in detail, of two organic materials used in contact with each other, one with lower ionization potential is called the donor-type organic compound. Therefore, any organic compound may be used as the donor-type organic compound as long as the organic compound having characteristic to donate electrons. Examples of the donor-type organic compound that can be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (naphthalene derivative, anthracene derivative, phenanthrene derivative, tetracene derivative, pyrene derivative, perylene derivative, fluoranthene derivative), a metal complex having a nitrogen-containing heterocyclic compound as a ligand, etc. The donor-type organic semiconductor is not limited thereto but any organic compound having lower ionization potential than the organic compound used as an n-type (acceptor-type) compound may be used as the donor-type organic semiconductor.

The n-type organic semiconductor (compound) is an acceptor-type organic semiconductor (compound) as chiefly represented by an electron transport organic compound, meaning an organic compound having characteristic to easily accept electrons. More specifically, when two organic compounds are used in contact with each other, one of the two organic compounds with higher electron affinity is the acceptor-type organic compound. Therefore, any organic compound may be used as the acceptor-type organic compound as long as the organic compound having characteristic to accept electrons. Examples thereof include a fused aromatic carbocyclic compound (naphthalene derivative, anthracene derivative, phenanthrene derivative, tetracene derivative, pyrene derivative, perylene derivative, fluoranthene derivative), a 5- to 7-membered heterocyclic compound containing a nitrogen atom, an oxygen atom or a sulfur atom (e.g. pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, tribenzazepine etc.), a polyarylene compound, a fluorene compound, a cyclopentadiene compound, a silyl compound, and a metal complex having a nitrogen-containing heterocyclic compound as a ligand. The acceptor-type organic semiconductor is not limited thereto. Any organic compound may be used as the acceptor-type organic semiconductor as long as the organic compound has higher electron affinity than the organic compound used as the donor-type organic compound.

As for p-type organic dye or n-type organic dye, any known dye may be used. Preferred examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic dyes (naphthalene derivative, anthracene derivative, phenanthrene derivative, tetracene derivative, pyrene derivative, perylene derivative, fluoranthene derivative).

A photoelectric conversion film (photosensitive layer) which has a layer of a p-type semiconductor and a layer of an n-type semiconductor between a pair of electrodes and at least one of the p-type semiconductor and the n-type semiconductor is an organic semiconductor and in which a bulk heterojunction structure layer including the p-type semiconductor and the n-type semiconductor is provided as an intermediate layer between those semiconductor layers may be used preferably. The bulk heterojunction structure layer included in the photoelectric conversion film can cover the defect that the carrier diffusion length of the organic layer is short. Thus, the photoelectric conversion efficiency can be improved. The bulk heterojunction structure has been described in detail in JP-A-2005-303266.

It is preferable that the photoelectric conversion film is thicker in view of absorption of light from the scintillator. The photoelectric conversion film is preferably not thinner than 30 nm and not thicker than 300 nm, more preferably not thinner than 50 nm and not thicker than 250 nm, particularly more preferably not thinner than 80 nm and not thicker than 200 nm in consideration of the ratio which does make any contribution to separation of electric charges.

As for any other configuration about the aforementioned OPC film, for example, refer to description in JP-A-2009-32854.

[8-2. Organic TFT (Thin Film Transistor)]

Although inorganic materials are often used for the aforementioned TFTs 42, organic materials may be used, for example, as disclosed in JP-A-2009-212389. Organic TFT may have any type of structure but a field effect transistor (FET) structure is the most preferable. In the FET structure, a substrate is disposed in the bottom layer, and a gate electrode is provided partially an upper surface of the substrate. An insulator layer is provided to cover the electrode and touch the substrate in the other portion than the electrode. Further, a semiconductor active layer is provided on an upper surface of the insulator layer, and a source electrode and a drain electrode are disposed partially on the upper surface of the semiconductor active layer and at a distance from each other. This configuration is called a top contact type device. A bottom contact type device in which a source electrode and a drain electrode are disposed under a semiconductor active layer may be also used preferably. In addition, a vertical transistor structure in which a carrier flows in the thickness direction of an organic semiconductor film may be used.

(Semiconductor Active Layer)

A p-type organic semiconductor material is used as the material of the semiconductor active layer. The p-type organic semiconductor material is substantially colorless and transparent. For example, the thickness of the organic semiconductor thin film may be measured by a stylus thickness meter. A plurality of thin films with different thicknesses may be manufactured and their absorption spectra may be measured so that the maximum absorbance per film thickness of 30 nm can be obtained by conversion based on a calibration curve.

Organic semiconductor materials mentioned herein are organic materials showing properties as semiconductors. Examples of the organic semiconductor materials include p-type organic semiconductor materials (or referred to as p-type materials simply or as electron hole transport materials) which conduct electron holes (holes) as carriers, and n-type organic semiconductor materials (or referred to as n-type materials simply or as electrode transport materials) which conduct electrons as carriers, similarly to a semiconductor formed out of an inorganic material. Of the organic semiconductor materials, lots of p-type materials generally show good properties. In addition, p-type transistors are generally excellent in operating stability as transistors under the atmosphere. Here, description here will be made on a p-type organic semiconductor material.

One of properties of organic thin film transistors is a carrier mobility (also referred to as mobility simply) n which indicates the mobility of a carrier in an organic semiconductor layer. Although preferred mobility varies in accordance with applications, higher mobility is generally preferred. The mobility is preferably not lower than $1.0*10^{-7}$ cm$^2$/Vs, more preferably not lower than $1.0*10^{-6}$ cm$^2$/Vs, further preferably not lower than $1.0*10^{-5}$ cm$^2$/Vs. The mobility can be obtained by properties or TOF (Time Of Flight) measurement when the field effect transistor (FET) device is manufactured.

The p-type organic semiconductor material may be either a low molecular weight material or a high molecular weight material, but preferably a low molecular weight material. Lots of low molecular weight materials typically show excellent properties due to easiness in high purification because various refining processes such as sublimation refining, recrystallization, column chromatography, etc. can be applied thereto, or due to easiness in formation of a highly ordered crystal structure because the low molecular weight materials have a fixed molecular structure. The molecular weight of the low molecular weight material is preferably not lower than 100 and not higher than 5,000, more preferably not lower than 150 and not higher than 3,000, further more preferably not lower than 200 and not higher than 2,000.

Preferred specific examples of such a p-type organic semiconductor material will be shown. Bu represents a butyl group, Pr represents a propyl group, Et represents an ethyl group, and Ph represents a phenyl group.

[Chemical 1]

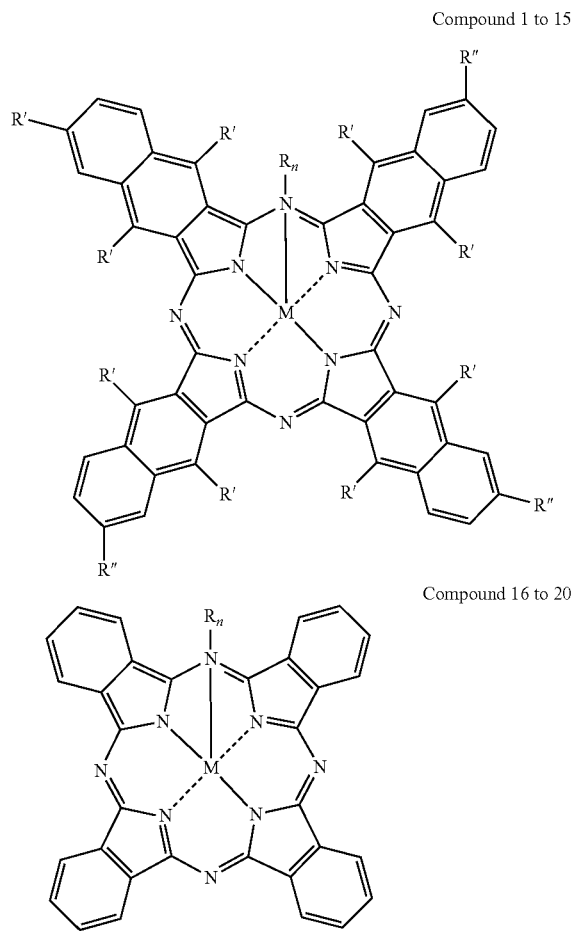

Compound 1 to 15

Compound 16 to 20

| Compound | M | R | n | R' | R" |
|---|---|---|---|---|---|
| 1 | Si | OSi(n-Bu)$_3$ | 2 | H | H |
| 2 | Si | OSi(i-Pr)$_3$ | 2 | H | H |
| 3 | Si | OSi(OEt)$_3$ | 2 | H | H |
| 4 | Si | OSiPh$_3$ | 2 | H | H |
| 5 | Si | O(n-C$_8$H$_{17}$) | 2 | H | H |
| 7 | Ge | OSi(n-Bu)$_3$ | 2 | H | H |
| 8 | Sn | OSi(n-Bu)$_3$ | 2 | H | H |
| 9 | Al | OSi(n-C$_6$H$_{13}$)$_3$ | 1 | H | H |
| 10 | Ga | OSi(n-C$_6$H$_{13}$)$_3$ | 1 | H | H |
| 11 | Cu | — | — | O(n-Bu) | H |
| 12 | Ni | — | — | O(n-Bu) | H |
| 13 | Zn | — | — | H | t-Bu |
| 14 | V=O | — | — | H | t-Bu |
| 15 | H$_2$ | — | — | H | t-Bu |
| 16 | Si | OSiEt$_3$ | 2 | — | — |
| 17 | Ge | OSiEt$_3$ | 2 | — | — |
| 18 | Sn | OSiEt$_3$ | 2 | — | — |
| 19 | Al | OSiEt$_3$ | 1 | — | — |
| 20 | Ga | OSiEt$_3$ | 1 | — | — |

(Device Constituent Materials Other than Semiconductor Active Layer)

Description will be made below on device constituent materials other than the semiconductor active layer in the organic thin film transistor. The visible-light or infrared-light transmittance of each of those materials is preferably not lower than 60%, more preferably not lower than 70%, further more preferably not lower than 80%.

The substrate is not limited particularly as long as it has required smoothness. Examples of the substrate include glass, quartz, light transmissive plastic film, etc. Examples of the light transmissive plastic film include films or the like, made from polyethylene terephthalate (PET), polyethylene naphthalate (PEN), polyether sulfone (PES), polyether imide, polyetheretherketone, polyphenylene sulfide, polyalylate, polyimide, polycarbonate (PC), cellulose triacetate (TAC), cellulose acetate propionate (CAP), etc. In addition, any organic or inorganic filler may be contained in these plastic films. A flexible substrate formed out of aramid, bionanofiber, or the like may be used preferably as the substrate.

The material forming the gate electrode, the source electrode or the drain electrode is not limited especially if it has required electric conductivity. Examples thereof include electrically conductive oxides such as ITO (indium-doped tin oxide), IZO (indium-doped zinc oxide), SnO$_2$, ATO (antimony-doped tin oxide), ZnO, AZO (aluminum-doped zinc oxide), GZO (gallium-doped zinc oxide), TiO$_2$, FTO (fluorine-doped tin oxide), etc., electrically conductive polymers such as PEDOT/PSS (poly(3,4-ethylenedioxythiophene)/polystyrenesulfonate), carbon materials such as carbon nanotube, etc. These electrode materials may be formed into films, for example, by a method such as a vacuum deposition method, sputtering, a solution application method, etc.

The material used for the insulating layer is not limited particularly as long as it has required insulating effect. Examples thereof include inorganic materials such as silicon dioxide, silicon nitride, alumina, etc., and organic materials such as polyester, (PEN (polyethylene naphthalate), PET (polyethylene terephthalate) etc.), polycarbonate, polyimide, polyamide, polyacrylate, epoxy resin, polyparaxylylene resin, novolak resin, PVA (polyvinyl alcohol), PS (polystyrene), etc. These insulating film materials may be formed into films, for example, by a method such as a vacuum deposition method, sputtering, a solution application method, etc.

As for any other configuration about the aforementioned organic TFT, for example, refer to description in JP-A-2009-212389.

[8-3. Amorphous Oxide Semiconductor]

For example, amorphous oxide disclosed in JP-A-2010-186860 may be used for the aforementioned TFTs 42. Here, description will be made on an amorphous oxide containing active layer of a FET transistor disclosed in JP-A-2010-186860. The active layer serves as a channel layer of the FET transistor where electrons or holes move.

The active layer has a configuration containing an amorphous oxide semiconductor. The amorphous oxide semiconductor can be formed into a film at a low temperature. Thus, the amorphous oxide semiconductor is formed preferably on a flexible substrate.

The amorphous oxide semiconductor used for the active layer is preferably amorphous oxide containing at least one kind of element selected from a group consisting of In, Sn, Zn and Cd, more preferably amorphous oxide containing at least one kind of element selected from a group consisting of In, Sn and Zn, further preferably amorphous oxide containing at least one kind of element selected from a group consisting of In and Zn.

Specific examples of the amorphous oxide used for the active layer include $In_2O_3$, ZnO, $SnO_2$, CdO, Indium-Zinc-Oxide (IZO), Indium-Tin-Oxide (ITO), Gallium-Zinc-Oxide (GZO), Indium-Gallium-Oxide (IGO), and Indium-Gallium-Zinc-Oxide (IGZO).

It is preferable that a vapor phase film formation method targeting at a polycrystal sinter of the oxide semiconductor is used as a method for forming the active layer. Of vapor phase film formation methods, a sputtering method or a pulse laser deposition (PLD) method is preferred. Further, the sputtering method is preferred in view from mass productivity. For example, the active layer is formed by an RF magnetron sputtering deposition method with a controlled degree of vacuum and a controlled flow rate of oxygen.

The thus formed active layer is confirmed to be an amorphous film by a well-known X-ray diffraction method. The composition ratio of the active layer is obtained by an RBS (Rutherford Backscattering Spectrometry) method.

In addition, the electric conductivity of the active layer is preferably lower than $10^2$ $Scm^{-1}$ and not lower than $10^{-4}$ $SCM^{-1}$, more preferably lower than $10^2$ $Scm^{-1}$ and not lower than $10^{-1}$ $Scm^{-1}$. Examples of the method for adjusting the electric conductivity of the active layer include a known adjusting method using oxygen defect, an adjusting method using a composition ratio, an adjusting method using impurities, and an adjusting method using an oxide semiconductor material.

As for any other configuration about the aforementioned amorphous oxide, for example, refer to description in JP-A-2010-186860.

[8-4. Flexible Material]

It may be considered that aramid, bionanofiber, etc. having properties such as flexibility, low thermal expansion and high strength, which cannot be obtained in existing glass or plastic, are used in a radiological image detection apparatus.

(1) Aramid

A film (or a sheet or a substrate) formed out of aramid which is a flexible material may be used as the support 101, the circuit board of the control module, or the like. An aramid material has high heat resistance showing a glass transition temperature of 315° C., high rigidity showing a Young's modulus of 10 GPa, and high dimensional stability showing a thermal expansion coefficient of −3 to 5 ppm/° C. Therefore, when a film made from aramid is used, it is possible to easily form a high-quality film for a semiconductor layer or a scintillator, as compared with the case where a general resin film is used. In addition, due to the high heat resistance of the aramid material, a transparent electrode material can be cured at a high temperature to have low resistance. Further, it is also possible to deal with automatic mounting with ICs, including a solder reflow step. Furthermore, since the aramid material has a thermal expansion coefficient close to that of ITO (indium tin oxide), a gas barrier film or a glass substrate, warp after manufacturing is small. In addition, cracking hardly occurs. Here, it is preferable to use a halogen-free (in conformity with the requirements of JPCA-ES01-2003) aramid material containing no halogens, in view of reduction of environmental load.

The aramid film may be laminated with a glass substrate or a PET substrate, or may be pasted onto a housing of a device. High intermolecular cohesion (hydrogen bonding force) of aramid leads to low solubility to a solvent. When the problem of the low solubility is solved by molecular design, an aramid material easily formed into a colorless and transparent thin film can be used preferably. Due to molecular design for controlling the order of monomer units and the substituent species and position on an aromatic ring, easy formation with good solubility can be obtained with the molecular structure kept in a bar-like shape with high linearity leading to high rigidity or dimensional stability of the aramid material. Due to the molecular design, halogen-free can be also achieved.

In addition, an aramid material having an optimized characteristic in an in-plane direction of a film can be used preferably. Tensional conditions are controlled in each step of solution casting, vertical drawing and horizontal drawing in accordance with the strength of the aramid film which varies constantly during casting. Due to the control of the tensional conditions, the in-plane characteristic of the aramid film which has a bar-like molecular structure with high linearity leading to easy occurrence of anisotropic physicality can be balanced.

Specifically, in the solution casting step, the drying rate of the solvent is controlled to make the in-plane thickness-direction physicality isotropic and optimize the strength of the film including the solvent and the peel strength from a casting drum. In the vertical drawing step, the drawing conditions are controlled precisely in accordance with the film strength varying constantly during drawing and the residual amount of the solvent. In the horizontal drawing, the horizontal drawing conditions are controlled in accordance with a change in film strength varying due to heating and controlled to relax the residual stress of the film. By use of such an aramid material, the problem that the aramid film after casting may be curled.

In each of the contrivance for the easiness of casting and the contrivance for the balance of the film in-plane characteristic, the bar-like molecular structure with high linearity peculiar to aramid can be kept to keep the thermal expansion coefficient low. When the drawing conditions during film formation are changed, the thermal expansion coefficient can be reduced further.

(2) Bionanofiber

Components sufficiently small relative to the wavelength of light produce no scattering of the light. Accordingly, a flexible plastic material, or the like, reinforced by nanofibers may be used preferably in the support 101, the circuit board of the control module, or the like. Of the nanofibers, a composite material (occasionally referred to as bionanofiber) of bacterial cellulose and transparent resin can be used preferably. The bacterial cellulose is produced by bacteria (*Acetobacter Xylinum*). The bacterial cellulose has a cellulose microfibril bundle width of 50 nm, which is about 1/10 as large as the wavelength of visible light. In addition, the bacterial cellulose is characterized by high strength, high elasticity and low thermal expansion.

When a bacterial cellulose sheet is impregnated with transparent resin such as acrylic resin or epoxy resin and hardened, transparent bionanofiber showing a light transmittance of about 90% in a wavelength of 500 nm while having a high fiber ratio of about 60 to 70% can be obtained. By the bionanofiber, a thermal expansion coefficient (about 3 to 7 ppm) as low as that of silicon crystal, strength (about 460 MPa) as high as that of steel, and high elasticity (about 30 GPa) can be obtained.

As for the configuration about the aforementioned bionanofiber, for example, refer to description in JP-A-2008-34556.

The aforementioned X-ray image detection apparatus 1 can be incorporated and used in various systems such as a medical X-ray imaging system. Particularly, the X-ray image detection apparatus 1 in this example having characteristics of high sensitivity and high definition can be preferably used in mammography equipment required to detect a sharp image with a low dose of radiation.

In addition to the medical X-ray imaging system, for example, the X-ray image detection apparatus 1 is also applicable to an industrial X-ray imaging system for nondestructive inspection, or a system for detecting particle rays (α-rays, β-rays, γ-rays) other than electromagnetic waves. The X-ray image detection apparatus 1 has a wide range of applications.

[9. Disclosure of Specification]

It is disclosed a radiological image detection apparatus, including: two scintillators that convert irradiated radiation into lights; and a photodetector arranged between two scintillators, that detects the lights converted by two scintillators as an electric signal; in which: an activator density in the scintillator arranged at least on a radiation incident side out of two scintillators in vicinity of the photodetector is relatively higher than an activator density in the scintillator on an opposite side to a photodetector side.

In addition, it is disclosed a radiological image detection apparatus, including: two scintillators that converts irradiated radiation into lights; and a photodetector arranged between two scintillators, that detects the lights converted by two scintillators as an electric signal; in which: an activator density in at least one scintillator out of two scintillators in vicinity of the photodetector is changed repeatedly between a high density and a low density in a radiation traveling direction.

In the radiological image detection apparatus, the photodetector may be formed on a substrate and then peeled off from the substrate.

In the radiological image detection apparatus, a distance between opposing surfaces of two scintillators may be less than 40 μm.

In the radiological image detection apparatus, the photodetector may be constructed by stacking a photoelectric layer that shows conductivity when receives the lights, and a thin film switching element for extracting electric charges from the photoelectric layer, or arranging planarly the photoelectric layer and the thin film switching element.

In the radiological image detection apparatus, at least one of the photoelectric layer and the thin film switching element may be formed of organic material.

In the radiological image detection apparatus, each of first and second scintillators may contain columnar portion, which is formed of a group of columnar crystals in which crystals of a corresponding fluorescent material have grown into columnar shapes.

In the radiological image detection apparatus, at least one of the first and second scintillators may contain a non-columnar portion that is formed on an opposite side to a photodetector side of the columnar portion.

In the radiological image detection apparatus, a base material of the fluorescent material of one of the first and second scintillators may be CsI, and an activator thereof may be Tl.

In the radiological detection apparatus, the first and second scintillators may be constructed by fluorescent materials whose sensitivity to the radiation is different mutually.

In the radiological detection apparatus, fluorescent materials of the first and second sintillators may be different in luminance colors mutually.

In the radiological detection apparatus, a base material of the fluorescent material of one of the first and second scintillators may be BaFX, and an activator thereof may be Eu.

In the radiological detection apparatus, a base material of the fluorescent material of the other of the first and second scintillators may be $Gd_2O_2S$, and an activator thereof may be Tb.

In the radiological detection apparatus, the photodetector may include first and second photodetectors corresponding to the first and second scintillators.

In addition, it is disclosed a method of manufacturing the radiological image detection apparatus, including: forming the photodetector on a substrate; and peeling off the substrate from the photodetector.

In the method of manufacturing the radiological image detection apparatus, the method may further include: after forming the photodetector on the substrate and pasting one of the first and second scintillators and the photodetector together, peeing off the substrate from the photodetector.

In the method of manufacturing the radiological image detection apparatus, the method may further include: forming the first and second scintillators on separate supports respectively; and after pasting one of the first and second scintillators and the photodetector together, peeling off the substrate from the photodetector, and pasting the photodetector and other of the first and second scintillators together.

In the method of manufacturing the radiological image detection apparatus, the method may further include: forming the photodetector and one of the first and second scintillators on the substrate in this order; after pasting a supporting member on an opposite side of one of the scintillators to the photodetector together, peeing off the substrate from the photodetector; and forming the other of the first and second scintillators on the photodetector.

In the method of manufacturing the radiological image detection apparatus, the method may further include: forming the photodetector and one of the first and second scintillators on the substrate in this order; pasting a supporting member on an opposite side of one of the scintillators to the photodetector side, and then peeling off the substrate from the photodetector; and forming the other of the first and second scintillators on the photodetector.

What is claimed is:

1. A radiological image detection apparatus, comprising:
two scintillators configured to convert irradiated radiation into lights; and
a photodetector arranged between two scintillators configured to detect the lights converted by the two scintillators as an electric signal; wherein:
an activator density in the scintillator arranged at least on a radiation incident side out of two scintillators in vicinity of the photodetector is relatively higher than an activator density in the scintillator on an opposite side to a photodetector side and the activator density in each of the two scintillators changes in a width direction in the scintillators.

2. The radiological image detection apparatus according to claim 1, wherein:
the photodetector is formed on a substrate and then peeled off from the substrate.

3. The radiological image detection apparatus according to claim 2, wherein:
a distance between opposing surfaces of two scintillators is less than 40 μm.

4. The radiological image detection apparatus according to claim 1, wherein:
the photodetector is constructed by stacking a photoelectric layer that shows conductivity when receives the lights, and a thin film switching element for extracting electric charges from the photoelectric layer, or arranging planarly the photoelectric layer and the thin film switching element.

5. The radiological image detection apparatus according to claim 4, wherein:

at least one of the photoelectric layer and the thin film switching element is formed of organic material.

6. The radiological image detection apparatus according to claim 1, wherein:
first and second scintillators each contains columnar portion, which is formed of a group of columnar crystals in which crystals of a corresponding fluorescent material have grown into columnar shapes.

7. The radiological image detection apparatus according to claim 6, wherein:
at least one of the first and second scintillators contains a non-columnar portion that is formed on an opposite side to a photodetector side of the columnar portion.

8. The radiological image detection apparatus according to claim 1, wherein:
a base material of the fluorescent material of one of the first and second scintillators is CsI, and an activator thereof is Tl.

9. The radiological detection apparatus according to claim 1, wherein:
the first and second scintillators are constructed by fluorescent materials whose sensitivity to the radiation is different mutually.

10. The radiological detection apparatus according to claim 9, wherein:
fluorescent materials of the first and second scintillators are different in luminance colors mutually.

11. The radiological detection apparatus according to claim 1, wherein:
a base material of the fluorescent material of one of the first and second scintillators is BaFX, and an activator thereof is Eu.

12. The radiological detection apparatus according to claim 11, wherein:
a base material of the fluorescent material of the other of the first and second scintillators is $Gd_2O_2S$, and an activator thereof is Tb.

13. The radiological detection apparatus according to claim 11, wherein:
the photodetector includes first and second photodetectors corresponding to the first and second scintillators.

14. A method of manufacturing the radiological image detection apparatus according to claim 1, comprising:
forming the photodetector on a substrate; and
peeling off the substrate from the photodetector.

15. The method of manufacturing the radiological image detection apparatus according to claim 14, further comprising:
after forming the photodetector on the substrate and pasting one of the first and second scintillators and the photodetector together, peeling off the substrate from the photodetector.

16. The method of manufacturing the radiological image detection apparatus according to claim 14, further comprising:
forming the first and second scintillators on separate supports respectively; and
after pasting one of the first and second scintillators and the photodetector together, peeling off the substrate from the photodetector, and pasting the photodetector and other of the first and second scintillators together.

17. The method of manufacturing the radiological image detection apparatus according to claim 14, further comprising:
forming the photodetector and one of the first and second scintillators on the substrate in this order;
after pasting a supporting member on an opposite side of one of the scintillators to the photodetector together, peeling off the substrate from the photodetector; and
forming the other of the first and second scintillators on the photodetector.

18. The method of manufacturing the radiological image detection apparatus according to claim 14, further comprising:
forming the photodetector and one of the first and second scintillators on the substrate in this order;
pasting a supporting member on an opposite side of one of the scintillators to the photodetector side, and then peeling off the substrate from the photodetector; and
forming the other of the first and second scintillators on the photodetector.

19. A radiological image detection apparatus, comprising:
two scintillators configured to convert irradiated radiation into lights; and
a photodetector arranged between two scintillators configured to detect the lights converted by two scintillators as an electric signal; wherein:
an activator density in at least one scintillator out of two scintillators in vicinity of the photodetector is changed repeatedly between a high density and a low density in a radiation traveling direction and the activator density in each of the two scintillators changes in a width direction in the scintillators.

* * * * *